United States Patent
Kundu et al.

(10) Patent No.: US 11,677,007 B2
(45) Date of Patent: *Jun. 13, 2023

(54) HEAT SINK LAYOUT DESIGNS FOR ADVANCED FINFET INTEGRATED CIRCUITS

(71) Applicant: TAIWAN SEMICONDUCTOR MANUFACTURING COMPANY, LTD., Hsinchu (TW)

(72) Inventors: Amit Kundu, Hsinchu (TW); Jaw-Juinn Horng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 102 days.

This patent is subject to a terminal disclaimer.

(21) Appl. No.: 17/172,714

(22) Filed: Feb. 10, 2021

(65) Prior Publication Data
US 2021/0167178 A1    Jun. 3, 2021

Related U.S. Application Data

(63) Continuation of application No. 16/425,874, filed on May 29, 2019, now Pat. No. 10,923,572.
(Continued)

(51) Int. Cl.
*H01L 29/78*    (2006.01)
*H01L 29/417*   (2006.01)
(Continued)

(52) U.S. Cl.
CPC .... *H01L 29/41791* (2013.01); *H01L 27/0207* (2013.01); *H01L 27/0886* (2013.01);
(Continued)

(58) Field of Classification Search
CPC ........... H01L 27/0207; H01L 29/41791; H01L 27/0886; H01L 29/785; H01L 29/0619; H01L 29/0623
See application file for complete search history.

(56) References Cited

U.S. PATENT DOCUMENTS 7,260,442 B2    8/2007    Hwang et al.
9,256,709 B2    2/2016    Yu et al.
(Continued)

OTHER PUBLICATIONS

E.Bury, et.al "Self-heating in FinFet and GAA-NW using Si, Ge and III/V channels", IEDM 2016, pp. IEDMI16-400-IMEDMI16-403.
(Continued)

*Primary Examiner* — Fernando L Toledo
*Assistant Examiner* — Valerie N Newton
(74) *Attorney, Agent, or Firm* — Hauptman Ham, LLP

(57) ABSTRACT

A layout of a semiconductor device stored on a non-transitory computer-readable medium includes a first transistor in an active device region, the first transistor comprising a first channel region a first source region and a first drain region. The layout further includes a second transistor in a guard ring region, the second transistor comprising a second channel region a second source region and a second drain region. The second channel region includes a semiconductor material having a higher thermal conductivity than a semiconductor material of the first channel region.

20 Claims, 15 Drawing Sheets

Related U.S. Application Data

(60) Provisional application No. 62/738,861, filed on Sep. 28, 2018.

(51) Int. Cl.
*H01L 49/02* (2006.01)
*H01L 27/088* (2006.01)
*H01L 29/06* (2006.01)
*H01L 27/02* (2006.01)

(52) U.S. Cl.
CPC .......... *H01L 28/20* (2013.01); *H01L 29/0619* (2013.01); *H01L 29/0638* (2013.01); *H01L 29/785* (2013.01)

(56) References Cited

U.S. PATENT DOCUMENTS

| | | |
|---|---|---|
| 9,536,790 B2 | 1/2017 | Kundu et al. |
| 10,923,572 B2 * | 2/2021 | Kundu ................ H01L 27/0886 |
| 2011/0070712 A1 | 3/2011 | Johnson et al. |
| 2014/0040838 A1 | 2/2014 | Liu et al. |
| 2014/0097496 A1 | 4/2014 | Hu et al. |
| 2015/0021713 A1 | 1/2015 | Cheng et al. |
| 2015/0187753 A1 | 7/2015 | Camp, Jr. et al. |
| 2015/0200249 A1 | 7/2015 | Kundu et al. |
| 2015/0278429 A1 | 10/2015 | Chang |
| 2015/0370937 A1 | 12/2015 | Liu et al. |
| 2016/0071847 A1 | 3/2016 | Song et al. |
| 2016/0254260 A1 | 9/2016 | Sheen et al. |
| 2018/0342575 A1 | 11/2018 | Tanaka |
| 2019/0067112 A1 | 2/2019 | Liang et al. |

OTHER PUBLICATIONS

Jang, et.al "Self-heating on bulk FinFET from 14nm down to 7nm node", IEDM 2015. pp. IEDMI15-289-IMEDMI15-292.

Asheghi, et al. "Thermal Conduction in Doped Single-Crystal Silicon Films", J. Appl. Phys., vol. 91, No. 8, pp. 5079-5088, Apr. 15, 2002.

O.M.Alatise, et.al "The impact of self-heating and SiGe strain-relaxed buffer thickness on the analog performance of strained Si nMOSFETs", Solid-state Electronics, vol. 54, Issue 3, pp. 327-335, Mar. 2010.

Baie, et al. "A novel tensile Si (n) and compressive SiGe (p) dual-channel CMOS FinFET co-integration scheme for 5nm logic applications and beyond", IEDM Tech Dig 2016, pp. 683-686.

* cited by examiner

HEAT SINK LAYOUT DESIGNS FOR ADVANCED FINFET INTEGRATED CIRCUITS

PRIORITY CLAIM

This application is a continuation of U.S. application Ser. No. 16/425,874, filed on May 29, 2019, which claims the priority of U.S. Provisional Application No. 62/738,861, filed Sep. 28, 2018, which are hereby incorporated by reference in their entireties.

BACKGROUND

Miniaturizing integrated circuits (ICs) has resulted in smaller devices which consume less power, yet provide more functionality at higher speeds than before. The miniaturization process has also resulted in various developments in IC designs and/or manufacturing processes to help to ensure device reliability and intended device performance.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion.

DETAILED DESCRIPTION

Figure 1A:
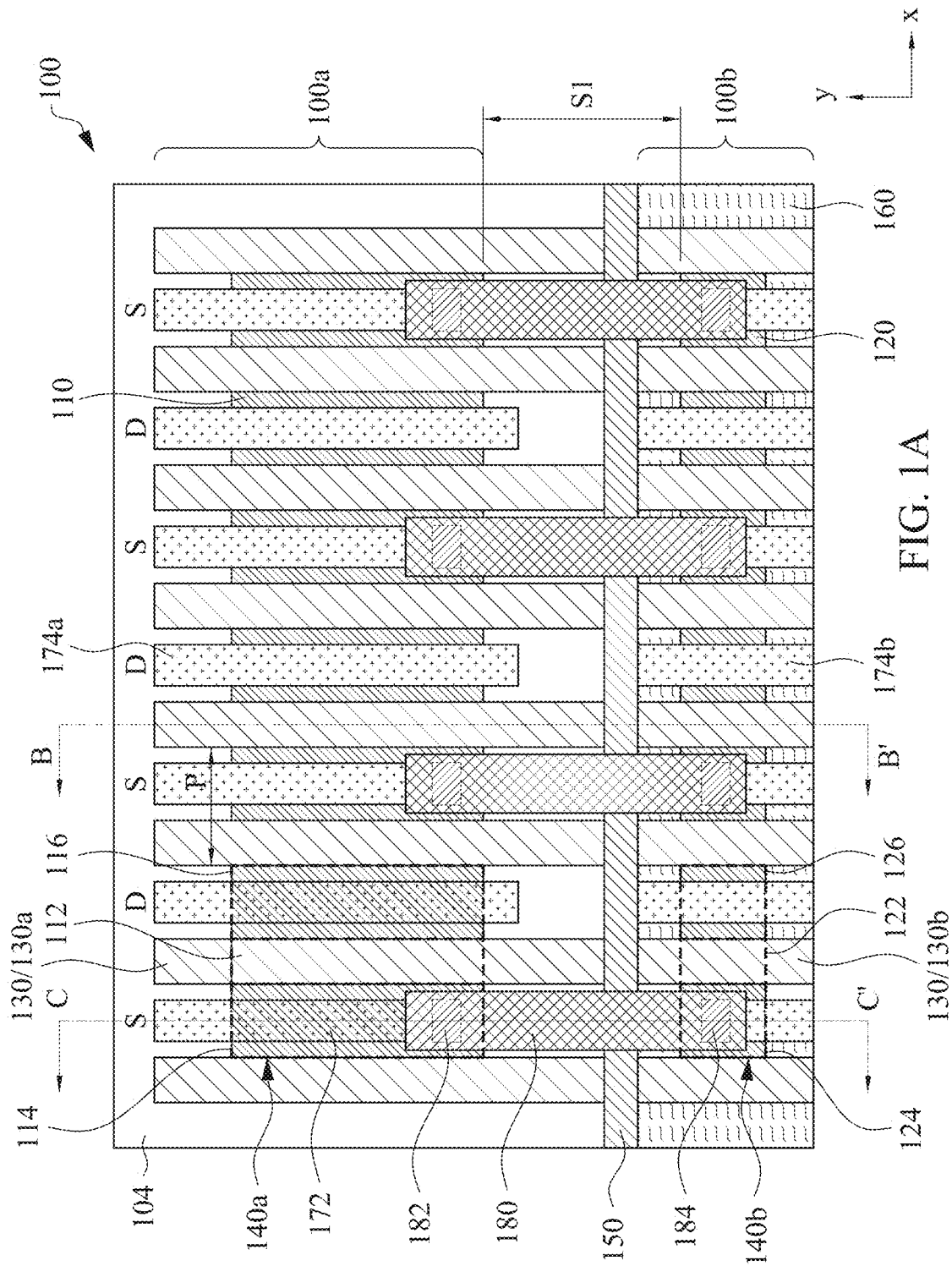
FIG. 1A is a plan view of a layout of a semiconductor device, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. System may be otherwise oriented (rotated 90 degrees or at other orientations) and the spatially relative descriptors used herein may likewise be interpreted accordingly.

Integrated circuits often increase in temperature during use, which often limits the performance and reliability of the integrated circuits. Self-heating effects in complementary metal oxide semiconductor (CMOS) logic transistors are becoming increasingly difficult to resolve as the dimension of the device is continuously scaled down. The higher operating temperature in the chip potentially causes many problems, such as variation in device performance, increase in off-state current, and reduction in device reliability. For example, self-heating increases the temperatures of metal interconnects, which accelerates electromigration (EM) failure of the metal interconnects. Self-heating also has adverse impacts on intrinsic device reliability mechanisms, such as bias temperature instability (BTI) and hot carrier injection (HCI).

A recent trend of introduction of new geometrically confined device structures like fin field effect transistors (FinFETs) and continuous incorporation of new materials having low thermal conductivities in the device active regions and metal contacts to boost device performance further exacerbates self-heating and hence device reliability concerns.

FinFETs, for example, are increasingly used in many logic and other applications and are integrated into various different types of semiconductor devices. FinFETs include semiconductor fins with high aspect ratios in which channel and source/drain regions for transistors are formed. A gate is formed over and along the sides of a portion of the semiconductor fins. The use of fins increases surface areas of the channel and source/drain regions, resulting in faster, more reliable and better-controlled transistors which consume less power in comparison with planar transistors. However, FinFET architectures result in significant self-heating due to the higher device density and narrower conductive path (small fin widths) compared to the planar metal oxide semiconductor field effect transistor (MOSFET) devices.

Strained silicon germanium (SiGe) has recently been used as a high mobility channel material in FinFETs. However, SiGe has a lower thermal conductivity than Si. For example, the thermal conductivity of SiGe with 50% of Ge is only about 10% of the thermal conductivity of pure Si. The low thermal conductivity of SiGe makes conduction cooling through the substrate less efficient, and increases the concerns associated with self-heating. Furthermore, as new technology uses cobalt (Co) with much higher electrical conductivity than copper as source/drain contacts, heat dissipation through upper interconnect metal layers in back-end-of-line (BEOL) is also impeded due to decreased thermal conductivity of cobalt compared to the copper or tungsten counterpart.

Therefore, self-heating has become a design concern for high performance circuitry as technology scales to even smaller dimensions. Other FinFET layout designs, however, do not sufficiently dissipate heat because other FinFET layout designs lack effective heat dissipation paths for diverting heat into the substrate.

Embodiments of the present disclosure provide FinFET design layouts with improved heat dissipation capability in comparison with other approaches. In some embodiments, the FinFET design layout includes guard ring, dummy devices or resistors to help to dissipate heat generated by active FinFETs to the substrate, thereby overcoming or reducing problems associated with self-heating resulting from low thermal transport of channel materials and contact metals in FinFET based integrated circuits. In some embodiments, the layouts of the present disclosure are useful for improving reliability of analog, mixed signal or radio frequency (RF) circuits.

FIG. 1A is a plan view of a layout 100 of a semiconductor device, in accordance with some embodiments.

Referring to FIG. 1A, layout 100 includes a plurality of semiconductor fins 110, 120 and a plurality of gate structures 130 usable for formation of a plurality FinFETs 140a in an active device region 100a and a plurality of FinFETs 140b in a guard ring region 100b adjacent to active device region 100a. FinFETs 140a in active device region 100a are capable of performing functions of an integrated circuit, however, FinFETs 140b in guard ring region 100b are not used for performing functions of the integrated circuit, rather FinFETs 140b are employed to provide electromagnetic shielding between different portions of the integrated circuit, so that devices in the integrated circuit maintain proper performance despite parasitic effect from neighboring devices. In use, FinFETs 140a generate heat. Because no or negligible power is applied to FinFETs 140b in guard ring region 100b, guard ring region 100b functions as a heat sink to remove the heat generated by FinFETs 140a. Guard ring region 100b is thus employed not only to provide electromagnetic shielding for FinFETs 140a in active device region 100a, but also to help to dissipate heat generated by FinFETs 140a. Dissipating the generated heat from active device region 100a mitigates electromigration degradation in BEOL interconnect metal layers, for example.

Active device region 100a includes at least one semiconductor fin 110, and guard ring region 100b includes at least one semiconductor fin 120. Although a single semiconductor fin 110 in active device region 100a and a single semiconductor fin 120 in guard ring region 100b are illustrated, the scope of the present disclosure is not limited thereto, and any number of semiconductor fins 110 and 120 are contemplated in active device region 100a and guard ring region 100b. Semiconductor fins 110, 120 extend along a first direction, e.g. the x direction and are isolated from each other by isolation structures 104. Adjacent semiconductor fins 110 and 112 in corresponding active device region 100a and guard ring region 100b are separated from each other by a spacing S1. A minimum spacing permitted by design rules for spacing S1 helps to maximize heat dissipation rate. In some embodiments, the at least one semiconductor fin 120 in guard ring region 100b is of similar size and shape as the at least one semiconductor fin 110 in active device region 100a. In other embodiments, semiconductor fin 120 in guard ring region 100b is substantially larger or smaller than semiconductor fin 110 in active device region 100a.

Gate structures 130 extend along a second direction, e.g., the y direction, across semiconductor fins 110, 120. In some embodiments, the second direction y is perpendicular to the first direction x. In some embodiments, gate structures 130 have a uniform pitch. A gate pitch p is defined as the summation of the width of a single gate structure and the distance between the single gate structure and an adjacent gate structure. In some embodiments, gate structures 130 have pitches different from each other. When gate structures 130 have a constant pitch, greater control over the critical dimension of gate structures 130 is achieved. Although eight gate structures are in FIG. 1A, the scope of the present disclosure is not limited thereto. In some embodiments, a single gate structure or a different number of gate structures is used. Gate structures 130 include gate structures 130a that cross over semiconductor fin 110 in active device region 100a, and gate structures 130b that cross over semiconductor fin 120 in guard ring region 100b.

Each FinFET 140a in active device region 100a includes a channel region 112 in a portion of semiconductor fin 110 underlying a corresponding gate structure 130a, and a source region 114 and a drain region 116 in portions of semiconductor fin 110 on opposite sides of the corresponding gate structure 130a. Source region 114 and drain region 116 surrounds channel region 112. Each FinFET 140b in guard ring region 100b includes a channel region 122 in a portion of semiconductor fin 120 underlying a corresponding gate structure 130b, and a source region 124 and a drain region 126 in portions of semiconductor fin 120 on opposite sides of the corresponding gate structure 130b. Source region 124 and drain region 126 surround channel region 122. Channel regions 112, 122 are relatively lightly doped regions, while source regions 114, 124 and drain regions 116, 126 are relatively heavily doped regions. In some embodiments, channel regions 112 and 122 include dopants of a first conductivity type, while source regions 114, 124 and drain regions 116, 126 includes dopants of a second conductivity type opposite the first conductivity type. In some embodiments, when the first conductivity type is p-type, the second conductivity type is n-type, or vice versa. In some embodiments, channel regions 112, 122 include n-type dopants, while source regions 114, 124 and drain regions 116, 126 include p-type dopants for formation of p-type FinFETs (pFinFETs). In some embodiments, channel regions 112, 122 include p-type dopants, while source regions 114, 124 and drain regions 116, 126 include n-type dopants for formation of n-type FinFETs (nFinFETs).

Layout 100 further includes a gate cut layer 150 extending along the first direction. Gate cut layer 150 is usable to identify locations where gate structures 130 are removed for electrical disconnection according to the integrated circuit design. Gate cut layer 150 in FIG. 1A is between active device region 100a and guard ring region 100b to indicate that gate structures 130a and 103b are disconnected from one another. In the design and manufacturing process of layout 100 on physical wafers, the presence of gate cut layer 150 indicates that gate structures 130 are initially formed as long and continuous strips extending through active device region 100a and guard ring region 100b, and then etched (cut) into shorter pieces in subsequent processes to provide gate structures 130a, 130b in respective active device region 100a and guard ring region 100b.

Layout 100 further includes a channel block layer 160 over guard ring region 100b. Channel block layer 160 is placed in alignment with channel regions 122 and is usable to indicate that a semiconductor material having a higher thermal conductivity than the semiconductor material provided channel regions 112 is used as a channel material in channel regions 122. Channel regions 122 are thus provided with high heat dissipation capacity and are usable to remove heat from active device region 100a to guard ring region 100b. In some embodiments, channel block layer 160 is a SiGe block layer when SiGe is employed as a channel material for enhancing carrier mobility in FinFET 140a. The presence of SiGe block layer indicates that SiGe is only present in channel regions 112, but not in channel regions 122, and instead a semiconductor material with a higher thermal conductivity than SiGe is used as the channel material in FinFET 140b to facilitate the heat dissipation to guard ring region 100b. In some embodiments, when channel regions 112 of FinFETs 140a in active device region 100a include SiGe, channel regions 122 of FinFETs 140b in guard ring region 100b include an intrinsic (non-doped) Si or a lightly doped Si. As used herein, lightly doped means a doping concentration less than about $1 \times 10^{13}$ atoms/cm$^3$. Because FinFETs 140b in guard ring region 100b are inactive devices, absence of SiGe in channel regions 122 of FinFETs 140b has no impact on circuit performance.

Channel block layer 160 is able to be generated using the available computer-aided design (CAD) library, therefore introducing channel block layer 160 in layout 100 is completed without creating any new CAD layer.

Layout 100 further includes a plurality of source contact structures 172 and a plurality of drain contact structures 174a and 174b. Source contact structures 172 extend from active device region 100a to guard ring region 100b. Each source contact structure 172 is over a corresponding source region 114 in active device region 100a and a corresponding source region 124 in guard ring region 100b, so as to couple the corresponding source region 114 in active device region 100a to the corresponding source region 124 in guard ring region 100b. Each source contact structure 172 thus functions as a heat conductive layer and helps to remove the heat generated by FinFETs 140a from source regions 114 of FinFETs 140a to guard ring region 100b. In some embodiments, each source contact structure 172 directly couples a corresponding source region 114 in active device region 100a to a corresponding source region 124 in guard ring region 100b. Drain contact structures include a first set of drain contact structures 174a over drain regions 116 of FinFETs 140a in active device region 100a, and a second set of drain contact structures 174b over drain regions 126 of FinFETs 140b in guard ring region 100b. Drain contact structures 174a are configured to provide electrical connection to the underlying drain regions 116 of FinFETs 140a in active device region 100a, while drain contact structures 174b are configured to provide electrical connection to the underlying drain regions 126 of FinFETs 140b in guard ring region 100b.

Layout 100 further includes a plurality of interconnect metal layers 180. Each interconnect metal layer 180 contacts at least one via 182 over a first portion of a corresponding source contact structure 172 in active device region 100a and at least one via 184 over a second portion of the corresponding source contact structure 172 in guard ring region 100b, thereby additionally coupling a corresponding source region 114 to guarding ring region 100b by way of at least the at least one via 182, the interconnect metal layer 180, and the at least one via 184. Each interconnect metal layer 180 thus functions as a heat conductive layer to provide an additional heat dissipation path through which the heat removed by a corresponding source contact structure 172 is transferred to the upper interconnect metal layers (not shown) in BEOL by way of vias 182, 184 and interconnect metal layer 180. In some embodiments, each interconnect metal layer 180 is used in the integrated circuit as an electrically coupled component configured to connect a corresponding source region 114 in active device region 100a to one or more other components of the integrated circuit.

In some embodiments, layout 100 is represented by a plurality of masks generated by one or more processors and/or stored in one or more non-transitory computer-readable media. Other formats for representing layout 100 are within the scope of various embodiments. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like. For example, layout 100 is presented by at least one first mask corresponding to semiconductor fins 110, 120, at least one second mask corresponding to gate structures 130, at least one third mask corresponding to gate cut layer 150, at least one fourth mask corresponding to channel block layer 160, at least one fifth mask corresponding to source contact structures 172 and drain contact structures 174a, 174b, and at least one sixth mask corresponding to interconnect metal layers 180 and vias 182, 184.

Figure 1B:
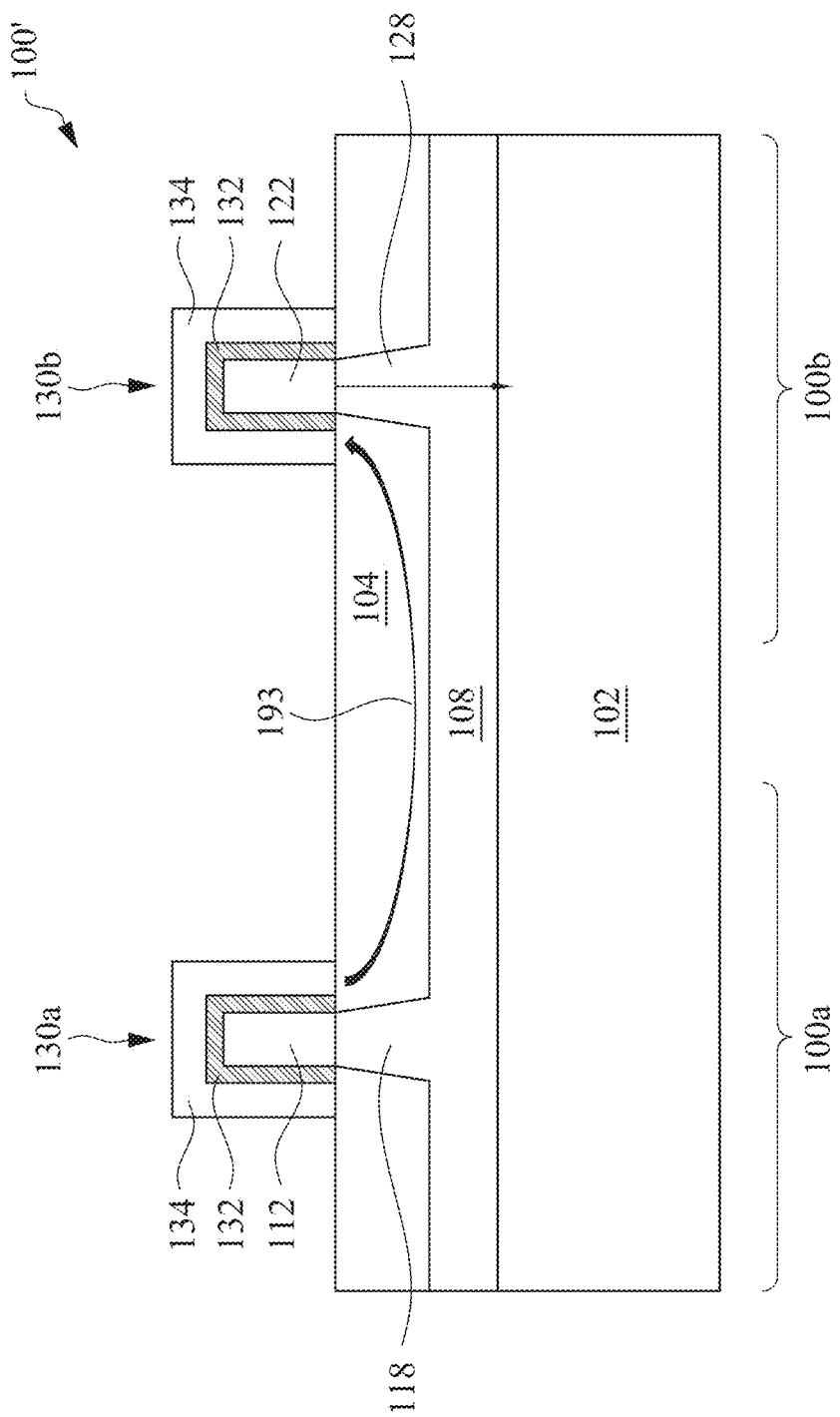
FIG. 1B is a cross-sectional view of a semiconductor device manufactured according to the layout of FIG. 1A and taken along line B-B' in FIG. 1A, in accordance with some embodiments.
Figure 1C:
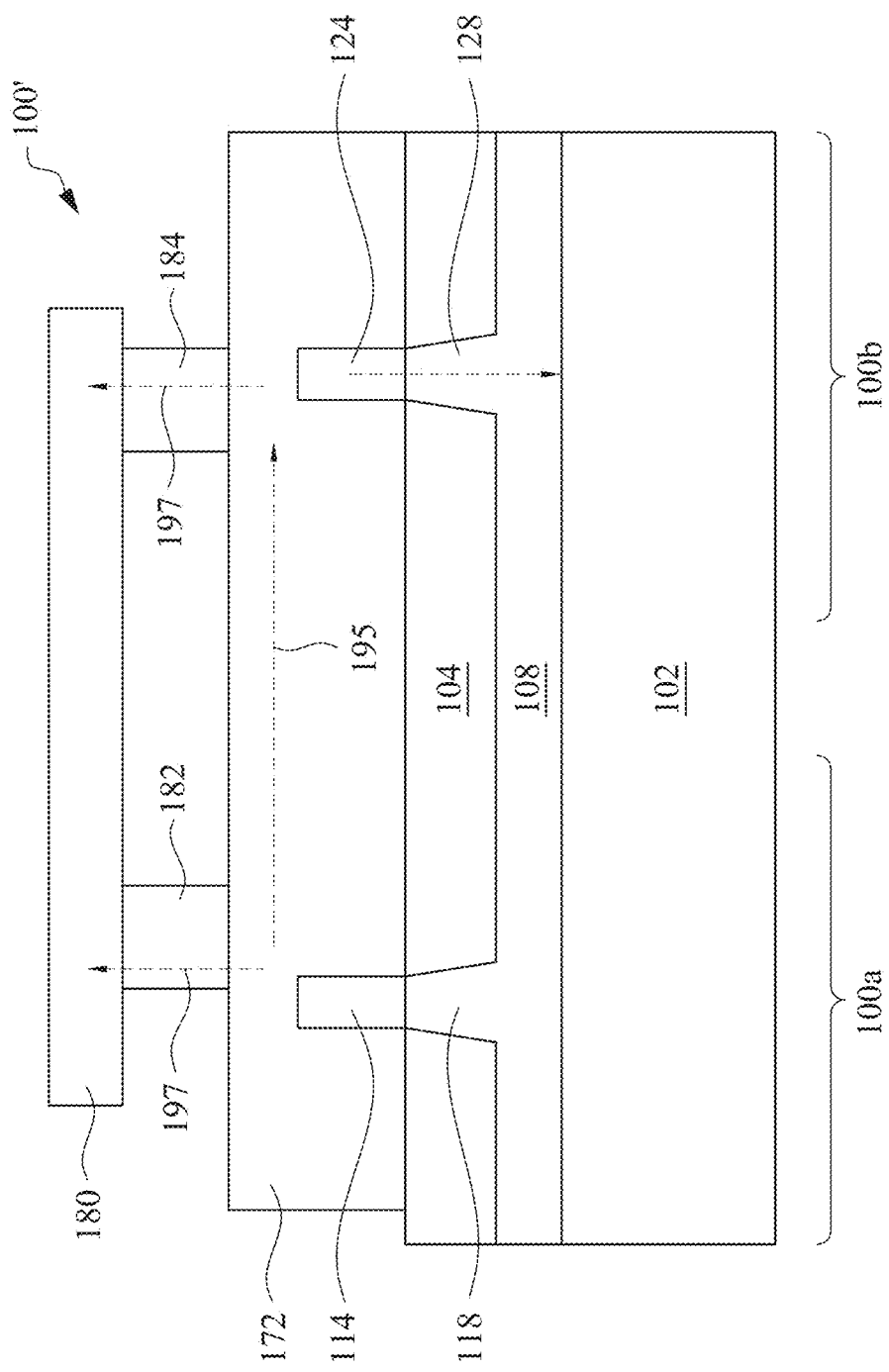
FIG. 1C is a cross-sectional view a semiconductor device manufactured according to the layout of FIG. 1A and taken along line C-C' in FIG. 1A, in accordance with some embodiments.

FIGS. 1B and 1C are cross-sectional views of a semiconductor device 100' manufactured according to the layout 100 depicted in FIG. 1A. The cross-sectional view in FIG. 1B is taken along line B-B' in FIG. 1A. The cross-sectional view in FIG. 1C is taken along line C-C' in FIG. 1A. Semiconductor device 100' is a non-limiting example for facilitating the illustration of the present disclosure. The configuration of the semiconductor device 100' is described herein with respect to both FIG. 1B and FIG. 1C.

Referring to FIGS. 1B and 1C, semiconductor device 100' includes a substrate 102 and isolation structures 104, semiconductor fins 110, 120, and gate structures 103a, 103b over substrate 102. In some embodiments, substrate 102 is a silicon substrate, or a substrate formed of other suitable semiconductor materials. In some embodiments, substrate 102 is doped with n-type or p-type dopants. Isolation structures 104 electrically isolate various components of semiconductor device 100' from one another. In some embodiments, isolation structures 104 include a dielectric material such as silicon dioxide, silicon nitride, silicon oxynitride, or any other suitable insulating material. Semiconductor fins 110 and 120 extend above the top surfaces of isolation structures 104 and are electrically isolated from each other by isolation structures 104. At least one semiconductor fin 110 is in active device region 100a of substrate 102. Gate structures 130a cross semiconductor fin 110 to define FinFETs 140a in active device region 100a of substrate 102. At least one semiconductor fin 120 is in guard ring region 100b of substrate 102. Gate structures 130b cross semiconductor fin 120 to define FinFETs 140b in guard ring region 100b of substrate 102. FinFETs 140a and 140b have similar structures and will be described collectively below.

Each FinFET 140a in active device region 100a includes a gate structure 130a across a channel region 112 of semiconductor fin 110, and a source region 114 and a drain region 116 in portions of semiconductor fin 110 on opposite sides of the gate structure 130a. Each FinFET 140b in guard ring region 100b includes a gate structure 130b across a channel region 122 of semiconductor fin 120, and a source region 124 and a drain region 126 in portions of semiconductor fin 120 on opposite sides of the gate structure 130b. In some embodiments, FinFETs 140a, 140b are nFinFETs, channel regions 112, 122 thus include p-type dopants such as boron, and source regions 114, 124 and drain regions 116, 126 include n-type dopants such as phosphorous or arsenic. To facilitate heat dissipation through substrate 102, respective channel regions 122 in guard ring regions 110b are provided with a semiconductor material having a thermal conductivity greater than a thermal conductivity of a semiconductor material that provide respective channel regions 112 in active device regions 110a. Channel regions 122 thus act as heat sinks to dissipate the heat generated by FinFETs 140a to substrate 102. In some embodiments, when channel regions 112 of FinFET 140a in active device region 100a include SiGe for increasing electron mobility of nFinFETs, channel regions 122 of FinFETs 140b in guard ring region 100b include Si to facilitate heat dissipation through substrate 102.

In some embodiments, each gate structure 130a, 130b contacts semiconductor fin 110, 120 on top surface and sidewalls thereof. In some embodiments, each gate structure 130a, 130b only contacts the sidewalls of semiconductor fin 110, 120 (not shown). Each gate structure 130a, 130b includes a gate dielectric layer 132 and a gate electrode layer 134. Example materials of gate dielectric layers 132 include, but are not limited to, a high-k dielectric layer, an interfacial layer, and/or combinations thereof. Example materials for the high-k dielectric layer include, but are not limited to, silicon nitride, silicon oxynitride, hafnium oxide ($HfO_2$), hafnium silicon oxide (HfSiO), hafnium silicon oxynitride (HfSiON), hafnium tantalum oxide (HMO), hafnium titanium oxide (HfTiO), hafnium zirconium oxide (HfZrO), metal oxides, metal nitrides, metal silicates, transition metal-oxides, transition metal-nitrides, transition metal-silicates, oxynitrides of metals, metal aluminates, zirconium silicate, zirconium aluminate, zirconium oxide, titanium oxide, aluminum oxide, hafnium dioxide-alumina ($HfO_2$—$Al_2O_3$) alloy, suitable high-k dielectric materials, and/or combinations thereof. In some embodiments, gate dielectric layer 132 includes multi-layer structure of, for example, $SiO_2$ with a high-k dielectric, or SiON with a high-k dielectric. In some embodiments, gate electrode layers 134 include a doped polycrystalline silicon (polysilicon). Alternatively, gate electrode layer 134 includes a metal such as aluminum, copper, tungsten, titanium, thallium, TiN, TaN, NiSi, CoSi, other suitable conductive materials, or combinations thereof.

Semiconductor device 100' further includes strained relaxed buffer (SRB) layers 118, 128. In the example configuration in FIGS. 1B and 1C, semiconductor device 100' includes a SRB layer 118 located between semiconductor fin 110 and substrate 102 in active device region 100a and a SRB layer 128 located between semiconductor fin 120 and substrate 102 in guard ring region 100b. SRB layers 118 and 128 are surrounded by isolation structures 104. In some embodiments, SRB layer 118 and SRB layer 128 are merged at the bottom thereof to form a common SRB layer 108 for semiconductor fin 110 and semiconductor fin 120. In some embodiments, SRB layer 118 and SRB layer 128 are separated at the bottom (not shown). SRB layers 118 include a material capable of increasing stress of channel regions 112 of FinFETs 140a. In some embodiments, when channel regions 112 of FinFETs 140a include SiGe having about 75% Si and 25% Ge for nFinFETs, SRB layers 118 include SiGe having about 50% of Si and 50% of Ge. SRB layer 118 provides a tensile stress to channel regions 112, thereby increasing the electron mobility in channel regions 112. As a result, the performance of FinFET 140a is enhanced. SRB layers 128 include a same material as SRB layer 118.

Semiconductor device 100' further includes contact structures to provide electrical connections to FinFETs 140a and FinFETs 140b. The contact structures includes source contact structures 172 for coupling source regions 114 of FinFETs 140a in active device region 100a to source regions 124 of FinFETs 140b in guard ring region, drain contact structures 174a (FIG. 1A) overlying drain regions 116 (FIG. 1A) of FinFETs 140a in active device region 100a, and drain contact structures 174b (FIG. 1A) overlying drain regions 126 (FIG. 1A) of FinFETs 140b in guard ring region 100b. Source contact structures 172 and drain contact structures 174a, 174b include a metal such as, for example, cobalt, copper, or tungsten.

Semiconductor device 100' further includes interconnect metal layers 180 to electrically couple source contact structures 172 with one or more other components of semiconductor device 100'. Each interconnect metal layer 180 contacts at least one via 182 over a first portion of a corresponding source contact structure 172 in active device region 100a and at least one via 184 over a second portion of the corresponding source contact structure 172 in guard ring region 100b to provide an additional heat dissipation path for FinFETs 140a through which the heat generated by FinFETs 140a is transferred to upper interconnect metal layers (not shown) of BEOL. Interconnect metal layers 180 and vias 182, 184 include, for example, aluminum, copper, tungsten, or alloys thereof.

The dashed arrows in FIGS. 1B and 1C show the heat dissipation paths in semiconductor device 100'. By utilizing a semiconductor material with high thermal conductivity as a channel material in channel regions 122 of FinFETs 140b in guard ring region 100b, heat generated by FinFETs 140a is able to be removed out of the structure through substrate 102 by way of channel regions 122 in guard ring region 100b as indicated by arrow 193 (FIG. 1B). In addition, some of the heat generated by FinFET 140a is dissipated from source regions 114 of FinFETs 140a to guard ring region 100b and then to substrate 102 by way of source contact structures 172 as indicated by arrow 195. Furthermore, some of the heat removed by source contact structures 172 is also able to be dissipated out of the structure through interconnect metal layers 180 above source contact structures 172 and further through upper interconnect metal layers (not shown) of BEOL as indicated by arrow 197.

Figure 2A:
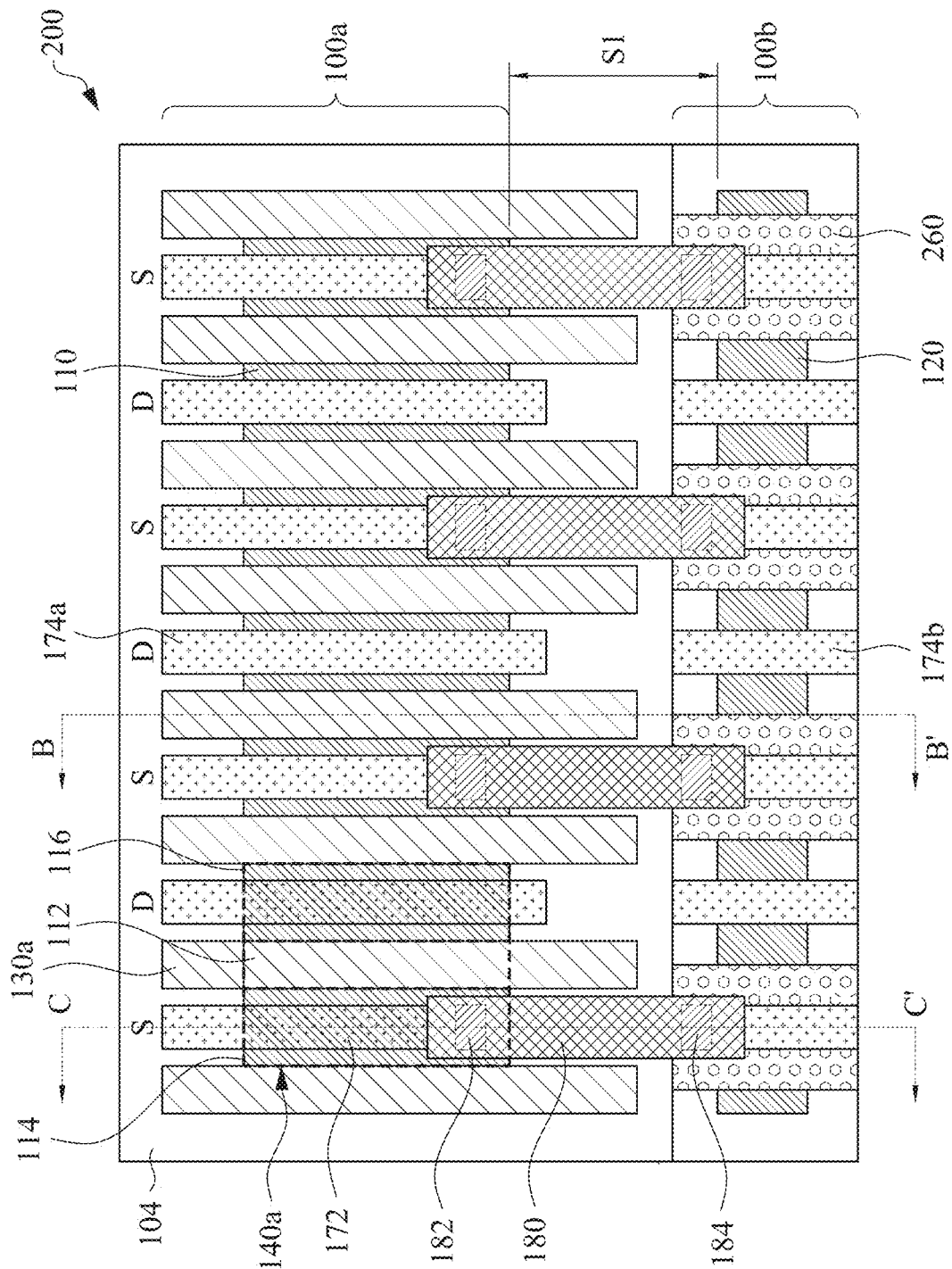
FIG. 2A is a plan view of a layout of a semiconductor device, in accordance with some embodiments.

FIG. 2A is a plan view of a layout 200 of a semiconductor device, in accordance with some embodiments. In comparison with layout 100 of FIG. 1A, in layout 200, an epitaxial block layer 260 replaces channel block layer 160 in guard ring region 100b for creating structures that allows better dissipating the heat. In some embodiments, in layout 200, gate structures 130b are removed from guard ring region 100b to further facilitate the heat dissipation. In some embodiments, gate structures 130b remain in guard ring region 100b (not shown).

Components in layout 200 that are the same or similar to those in FIGS. 1A-1C are given the same references numbers, and detailed description thereof is thus omitted.

Referring to FIG. 2A, epitaxial block layer 260 is placed in guard ring region 100b. Epitaxial block layer 260 is usable to indicate that all the materials having low thermal conductivities used in the epitaxial regions including channel regions 112, source regions 114 and drain regions 116 of FinFETs 140a as well as SRB layer 118 in active device region 110a are blocked in guard ring region 100b. Therefore, only semiconductor materials having high thermal conductivities are utilized in guard ring region 100b. In some embodiments, guard ring region 100b includes a semiconductor material having a thermal conductivity greater than 100 W/mk. Depending on design rules, in some embodiments, epitaxial block layer 260 is provided as a continuous layer to cover an entirety of guard ring region 100b (not shown), and in some embodiments, epitaxial block layer 260 is provided as a plurality of non-continuous segments such that only portions of guard ring region 100b where high thermal conductivity semiconductor material are desirable are covered by epitaxial block layer 260 (FIG. 2A). Similar to channel block layer 160 in layout 100 of FIG. 1A, epitaxial block layer 260 in layout 200 is able to be generated using the available computer-aided design (CAD) library, therefore introducing epitaxial block layer 260 in layout 200 is completed without creating any new CAD layer.

In some embodiments, layout 200 is represented by a plurality of masks generated by one or more processors and/or stored in one or more non-transitory computer-readable media. Other formats for representing layout 200 are within the scope of various embodiments. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like. For example, layout 200 is presented by at least one first mask corresponding to semiconductor fins 110, 120, at least one second mask corresponding to gate structures 130a, at least one third mask corresponding to epitaxial block layer 260, at least one fourth mask corresponding to source contact structures 172 and drain contact structures 174a, 174b, and at least one fifth mask corresponding to interconnect metal layers 180 and vias 182, 184.

Figure 2B:
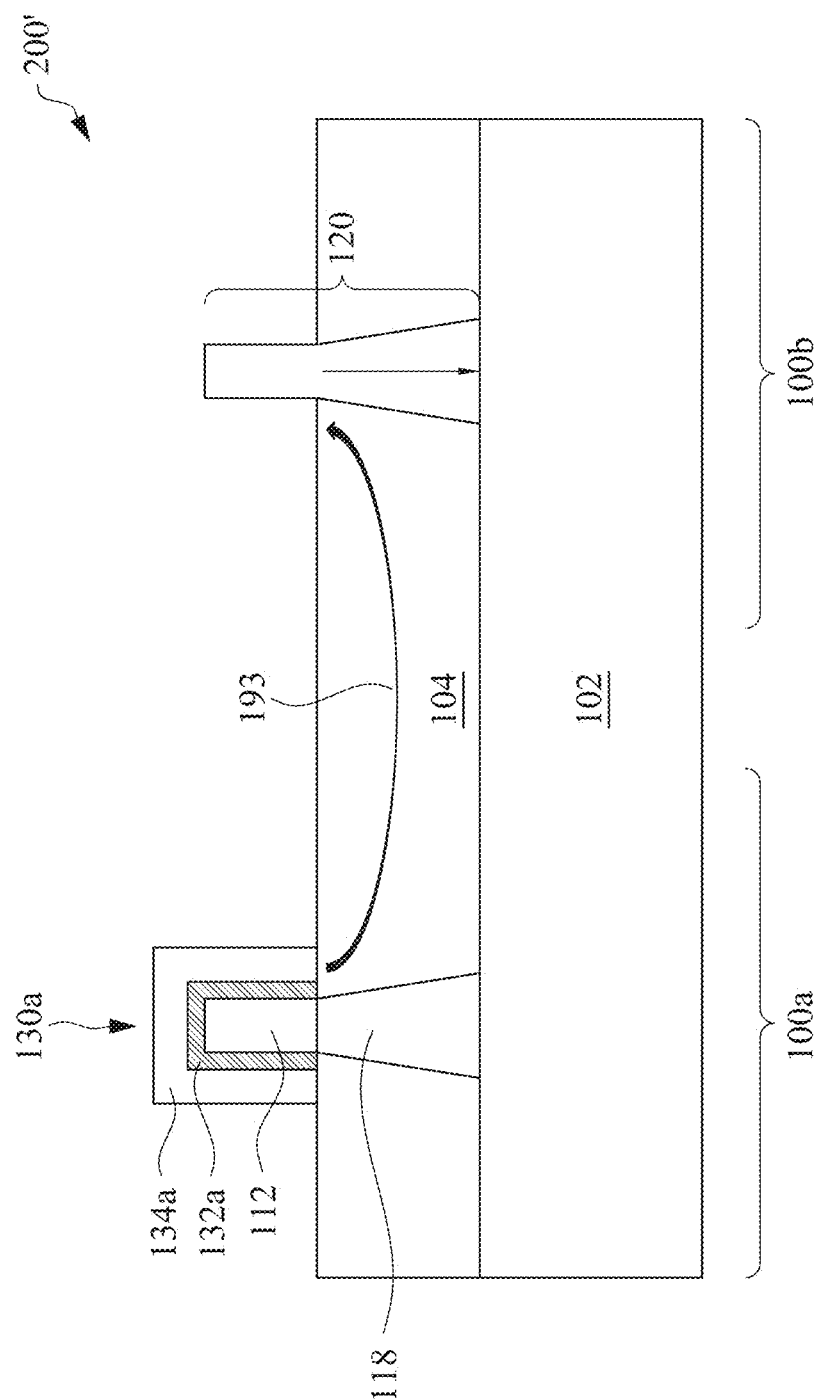
FIG. 2B is a cross-sectional view of a semiconductor device manufactured according to the layout of FIG. 2A and taken along line B-B' in FIG. 2A, in accordance with some embodiments.
Figure 2C:
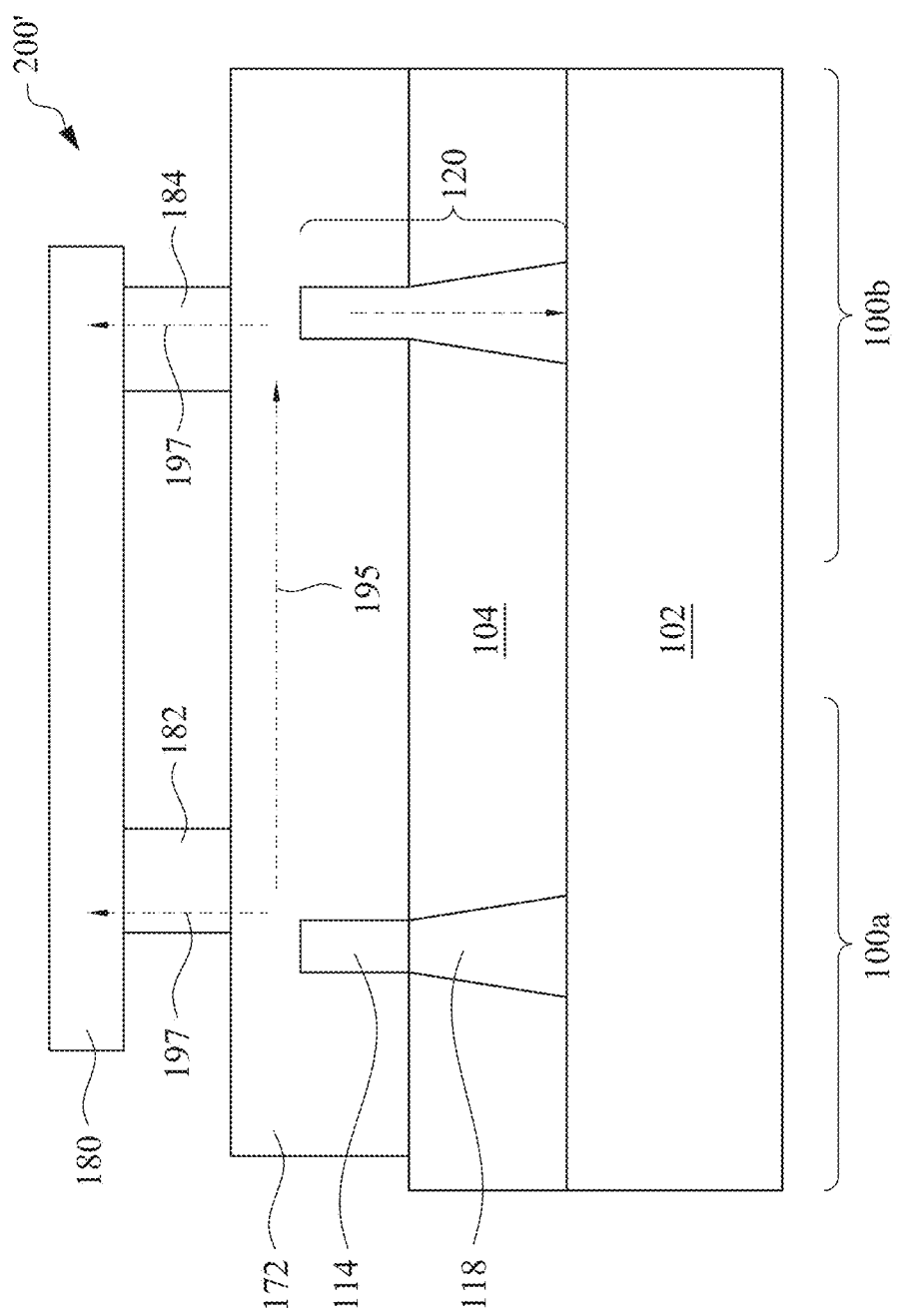
FIG. 2C is a cross-sectional view a semiconductor device manufactured according to the layout of FIG. 2A and taken along line C-C' in FIG. 2A, in accordance with some embodiments.

FIGS. 2B and 2C are cross-sectional views of a semiconductor device 200' manufactured according to the layout 200 of FIG. 2A. The cross-sectional view in FIG. 2B is taken along line B-B' in FIG. 2A. The cross-sectional view in FIG. 2C is taken along line C-C' in FIG. 2A. The configuration of the semiconductor device 200' is described herein with respect to both FIG. 2B and FIG. 2C. Components in semiconductor device 200' that are the same or similar to those in FIGS. 1A-1C are given the same references numbers, and detailed description thereof is thus omitted.

Referring to FIGS. 2B and 2C, in comparison with semiconductor device 100' of FIGS. 1B and 1C, in semiconductor device 200', SRB layer 128 is not formed in guard ring region 100b such that semiconductor fin 120 in guard ring region 100b is in direct contact with substrate 102 to enable a direct heat dissipation from semiconductor fin 120 to the underlying substrate 102. In addition, an entire semiconductor fin 120 in guard ring region 100b is provided to comprise a semiconductor material having a higher thermal conductivity than semiconductor materials that provide respective channel regions 112, source regions 114 and drain regions 116 of FinFETs 140a in active device region 100a so as to provide an increased heat dissipating surface area. For example, in active device region 100a, when channel regions 112 include strained Si, and source regions 114 and drain regions 116 include n-doped SiGe for formation of nFinFETs 140a, or when channel regions 112 include strained SiGe, and source regions 114 and drain regions 116 include p-doped SiGe for formation of pFinFETs 140a, SiGe is not used in guard ring region 100b, and semiconductor fin 120 in guard ring region 100b comprises solely Si which has a higher thermal conductivity than SiGe.

Furthermore, gate structures 130b are also removed from guard ring region 100b. The removal of gate structures 130b removes dielectric materials employed in gate structures 130b that have relatively poor conductivities from guard ring region 100b so as to further facilitate the heat dissipation through substrate 102.

Eliminating both gate structures 130a and epitaxial semiconductor materials with low thermal conductivities in guard ring region 100b results in more efficient heat removal through substrate 102.

Similar to semiconductor device 100' of FIGS. 1B and 1C, the heat generated by FinFETs 140a in active device region 100a is able to be dissipated through substrate 102 as indicated by arrow 193, through source contact structures 172 as indicated by arrow 195, and through interconnect metal layers 180 as indicated by arrow 197.

Figure 3:
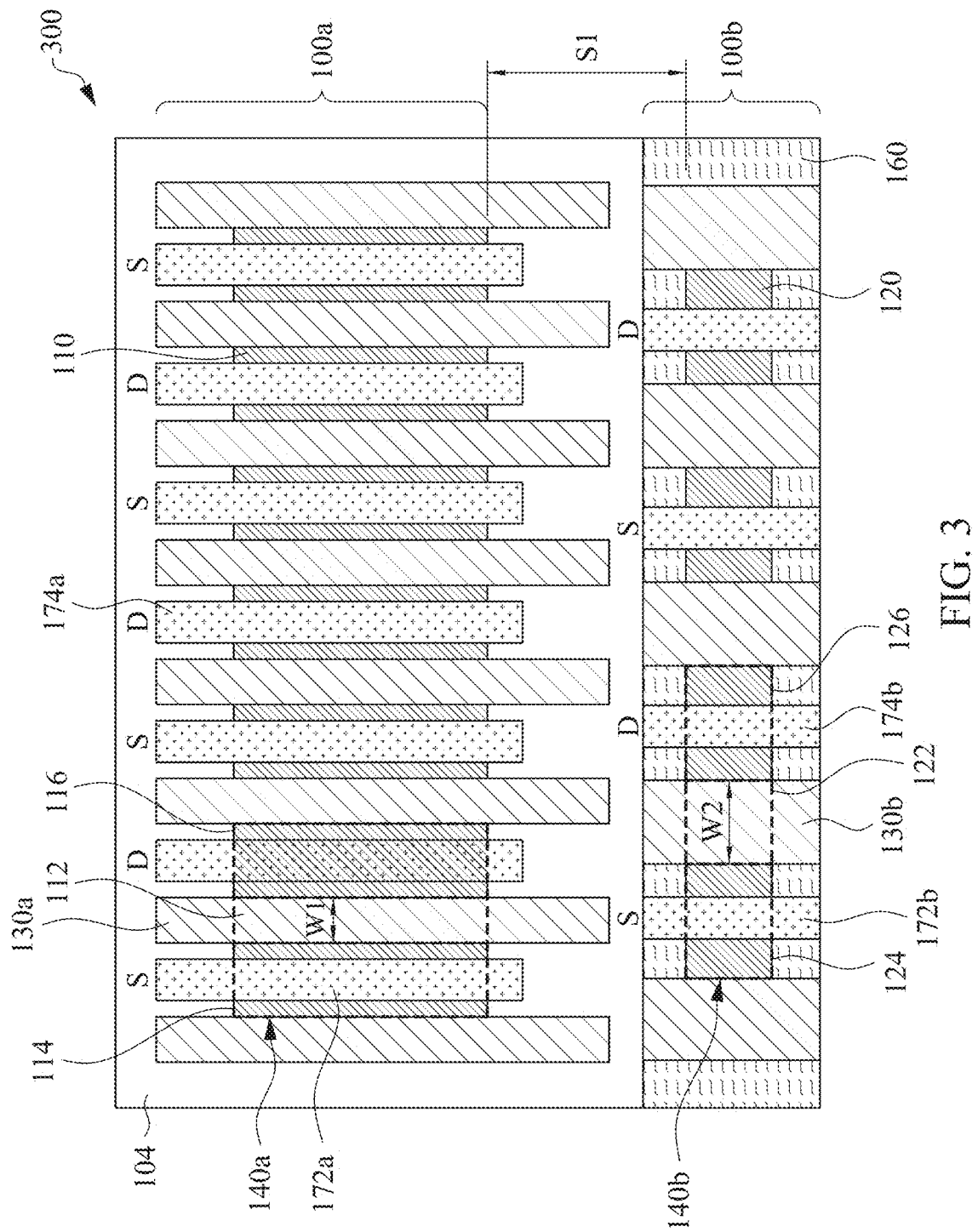
FIG. 3 is a plan view of a layout of a semiconductor device, in accordance with some embodiments.

FIG. 3 is a plan view of a layout 300 of a semiconductor device, in accordance with some embodiments. In comparison with layout 100 of FIG. 1A, in layout 300, FinFETs 140b in guard ring region 100b are configured to have a channel length greater than a channel length of FinFETs 140a in active device region 100a. Components in FIG. 3 that are the same or similar to those in FIGS. 1A-1C are given the same references numbers, and detailed description thereof is thus omitted.

Referring to FIG. 3, layout 300 includes FinFETs 140a in active device region 100a and FinFETs 140b in guard ring region 100b. Each FinFET 140a includes a gate structure 130a across a channel region 112 of a semiconductor fin 110. Each FinFET 140b includes a gate structure 130b across a channel region 122 of a semiconductor fin 120. A channel length of a FinFET is defined by the width of a gate structure. In layout 300, each gate structure 130a in active device region 110a has a width W1 measurable along the x direction, and each gate structure 130b in guard ring region 100b has a width W2 measurable along the x direction. The width W2 is set to be greater than the width W1 so as to provide a greater channel length for FinFET 140b in guard ring region 100b. The greater channel length of FinFETs 140b in guard ring region 100b increases heat dissipation surface area, thereby allowing more heat to be dissipated through underlying substrate. As a result, the self-heating effect of the resulting integrated circuit is reduced.

Unlike layout 100 in which a single source contact structure 172 is used to couple both source region 114 in active device region 100a and source region 124 in guard ring region 100b, in layout 300 source contact structures 172a are formed to contact respective source regions 114 of FinFETs 140a in active device region 100a and source contact structures 172b are formed to contact respective source region 124 in guard ring region 100b. Source contact structures 172a provide electrical connection to source regions 114, while source contact structures 172b provide electrical connection to source regions 124. Because no single source contact structure that couples both source region 114 and source region 124 is available in layout 300, heat dissipation in layout 300 is mainly through the substrate over which FinFETs 140a, 140b are formed.

In some embodiments, layout 300 is represented by a plurality of masks generated by one or more processors and/or stored in one or more non-transitory computer-readable media. Other formats for representing layout 300 are within the scope of various embodiments. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like. For example, layout 300 is presented by at least one first mask corresponding to semiconductor fins 110, 120, at least one second mask corresponding to gate structures 130a, 130b, at least one third mask corresponding to channel block layer 160, at least one fourth mask corresponding to source contact structures 172a, 172b and drain contact structures 174a, 174b, and at least one fifth mask corresponding to interconnect metal layers 180 and vias 182, 184.

Layout 300 uses a channel block layer 160 in guard ring region 100b, one of ordinary skill would understand that using epitaxial block layer 260 of FIG. 2A in guard ring region 100b is contemplated and within the scope of the present disclosure.

Figure 4:
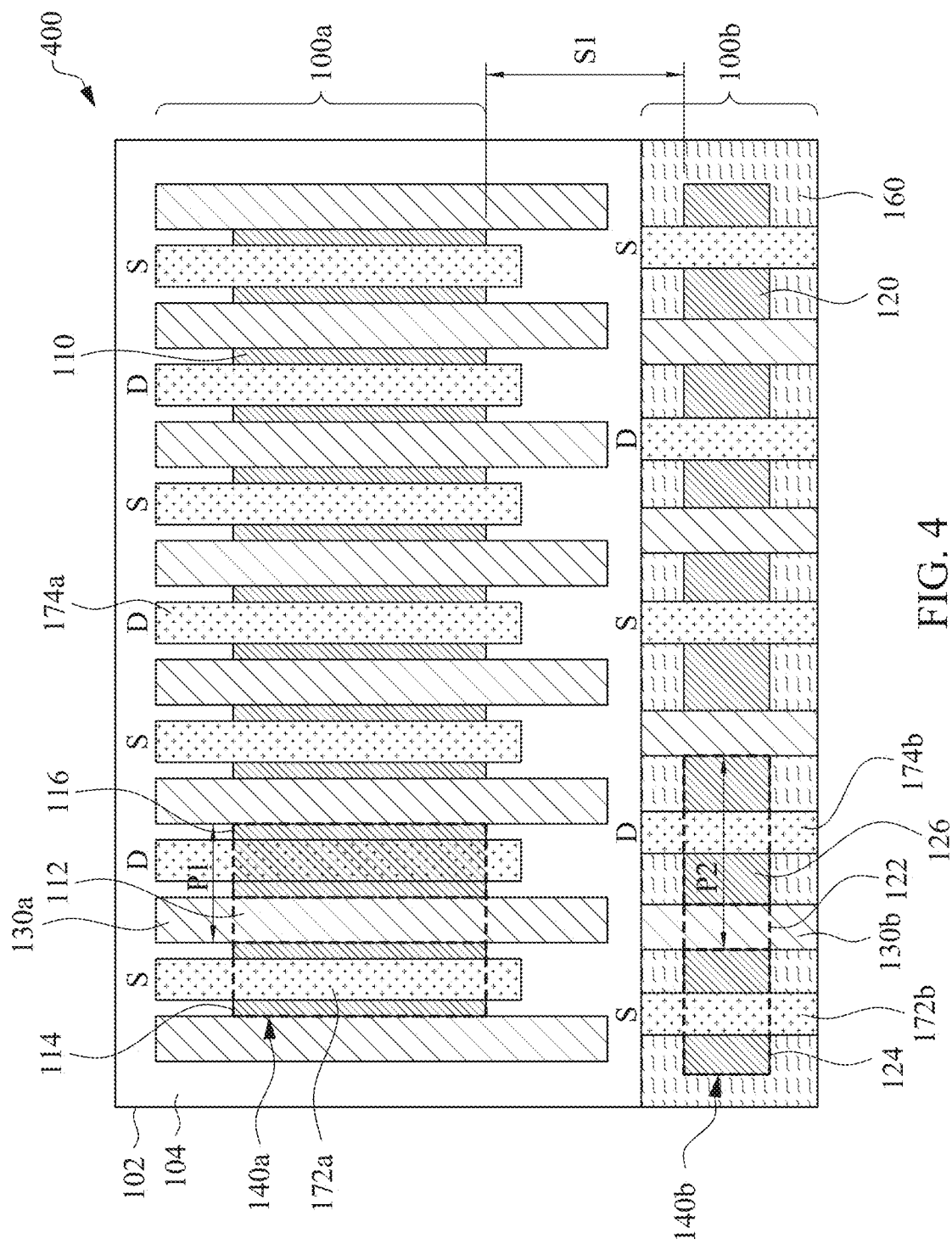
FIG. 4 is a plan view of a layout of a semiconductor device, in accordance with some embodiments.

FIG. 4 is a plan view of a layout 400 of a semiconductor device, in accordance with some embodiments. In comparison with layout 100 of FIG. 1A, in layout 400, gate structures 130b in guard ring region 100b are configured to have a gate pitch P2 greater than a gate pitch P1 of gate structures 130a in active device region 100a. Components in FIG. 4 that are the same or similar to those in FIGS. 1A-1C are given the same references numbers, and detailed description thereof is thus omitted.

Referring to FIG. 4, layout 400 includes FinFETs 140a in active device region 100a and FinFETs 140b in guard ring region 100b. Each FinFET 140a includes a gate structure 130a across a channel region 112 of a semiconductor fin 110. Each FinFET 140b includes a gate structure 130b across a channel region 122 of a semiconductor fin 120. In layout 400, gate structures 130a in active device region 100a have a pitch P1 measurable along the x direction, and gate structures 130b in guard ring region 100b have a pitch P2 measurable along the x direction. The gate pitch P2 is set to be greater than the gate pitch P1. The greater gate pitch for gate structures 130b in guard ring region 100b helps to reduce the self-heating effect of the resulting integrated circuit due to larger area for heat dissipation. In some embodiments and as shown in FIG. 4, gate structures 130b have a same width as the gate structures 130a, while source regions 124 have a greater width than source region 114, and drain regions 126 have a greater width than drain regions 116.

Layout 400 further includes source contact structures 172a contacting respective source regions 114 of FinFETs 140a in active device region 100a and source contact structures 172b contacting respective source region 124 in guard ring region 100b. Source contact structures 172a provide electrical connection to source regions 114, while source contact structures 172b provide electrical connection to source region 124. Because no single source contact structure that couples both source region 114 and source region 124 is available in layout 400, heat dissipation in layout 400 is mainly through the underlying substrate.

In some embodiments, layout 400 is represented by a plurality of masks generated by one or more processors and/or stored in one or more non-transitory computer-readable media. Other formats for representing layout 400 are within the scope of various embodiments. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like. For example, layout 400 is presented by at least one first mask corresponding to semiconductor fins 110, 120, at least one second mask corresponding to gate structures 130a, 130b, at least one third mask corresponding to channel block layer 160, at least one fourth mask corresponding to source contact structures 172a, 172b and drain contact structures 174a, 174b, and at least one fifth mask corresponding to interconnect metal layers 180 and vias 182, 184.

Layout 400 uses a channel block layer 160 in guard ring region 100b, one of ordinary skill would understand that using epitaxial block layer 260 of FIG. 2A in guard ring region 100b is contemplated and within the scope of the present disclosure.

Figure 5:
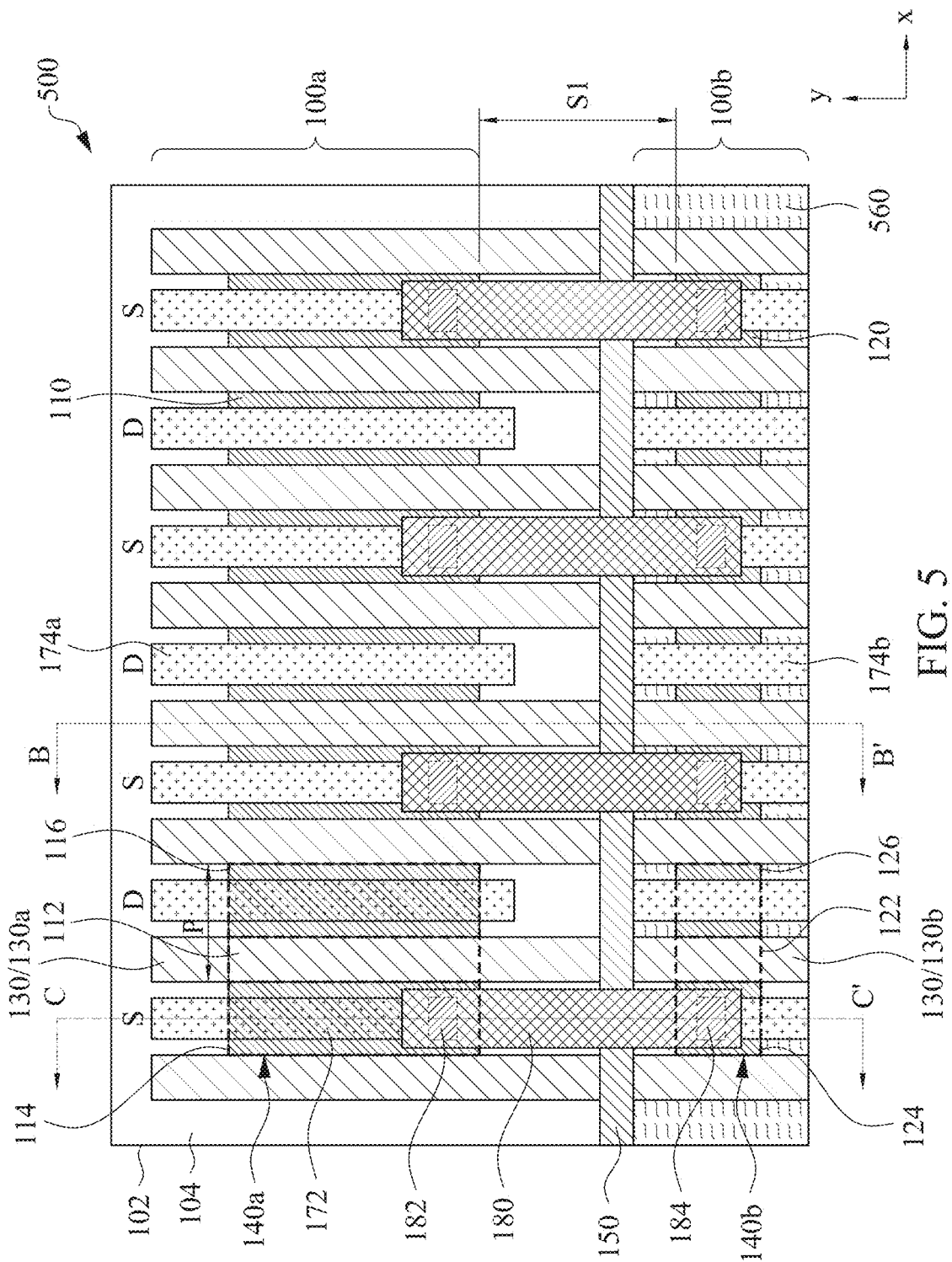
FIG. 5 is a plan view of a layout of a semiconductor device, in accordance with some embodiments.

FIG. 5 is a plan view of a layout 500 of a semiconductor device, in accordance with some embodiments. In comparison with layout 100 of FIG. 1A, in layout 500, a native, or NT_N layer 560 replaces channel block layer 160 in guard ring region 100b. Components in FIG. 5 that are the same or similar to those in FIGS. 1A-1C are given the same references numbers, and detailed description thereof is thus omitted.

Referring to FIG. 5, NT_N layer 560 is in alignment with channel regions 122 of FinFETs 140b. NT_N layer 560 is usable to define regions devoid of doping. In some embodiments, NT_N layer 560 is added in layout 500 to indicate that channel regions 122 of FinFETs 140b in guard ring region 100b are not doped with either p-type dopants or n-type dopants. In some embodiments, NT_N layer 560 is added in layout 500 to indicate that channel regions 122 of FinFETs 140b in guard ring region 100b have a lower doping concentration than the doping concentration of channel regions 112 of FinFET 140a in active device region 100a. Higher doping concentration has been known to reduce the thermal conductivity of Si due to the increased phonon boundary scattering. Thus, the reduction of the doping concentration in channel regions 122 in guard ring region 100b reduces the thermal resistance of channel material, which helps to facilitate heat dissipation through the underlying substrate.

Similar to channel block layer 160 in layout 100 of FIG. 1A, NT_N layer 560 in layout 500 is able to be generated using the available computer-aided design (CAD) library, therefore introducing NT_N layer 560 in layout 500 is completed without creating any new CAD layer.

Layout 500 is able to dissipate generated heat out of the structure by way of underlying substrate, source contact structures 172 and interconnect metal layers 180.

Though in layout 500, gate structures 130*b* in guard ring region 100*b* are illustrated as having the same gate width and the same gate spacing as gate structures 130*a* in active device region 100*a*, in some embodiments, gate structures 130*b* with larger gate width and/or larger gate spacing illustrated in FIGS. 3 and 4 in conjunction with the adding of NT_N layer 560 to further increase heat dissipation capabilities of the integrated circuit are contemplated.

In some embodiments, layout 500 is represented by a plurality of masks generated by one or more processors and/or stored in one or more non-transitory computer-readable media. Other formats for representing layout 500 are within the scope of various embodiments. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like. For example, layout 500 is presented by at least one first mask corresponding to semiconductor fins 110, 120, at least one second mask corresponding to gate structures 130, at least one third mask corresponding to gate cut layer 150, at least one fourth mask corresponding to NT_N layer 560, at least one fifth mask corresponding to source contact structures 172 and drain contact structures 174*a*, 174*b*, and at least one six mask corresponding to interconnect metal layers 180 and vias 182, 184.

Figure 6:
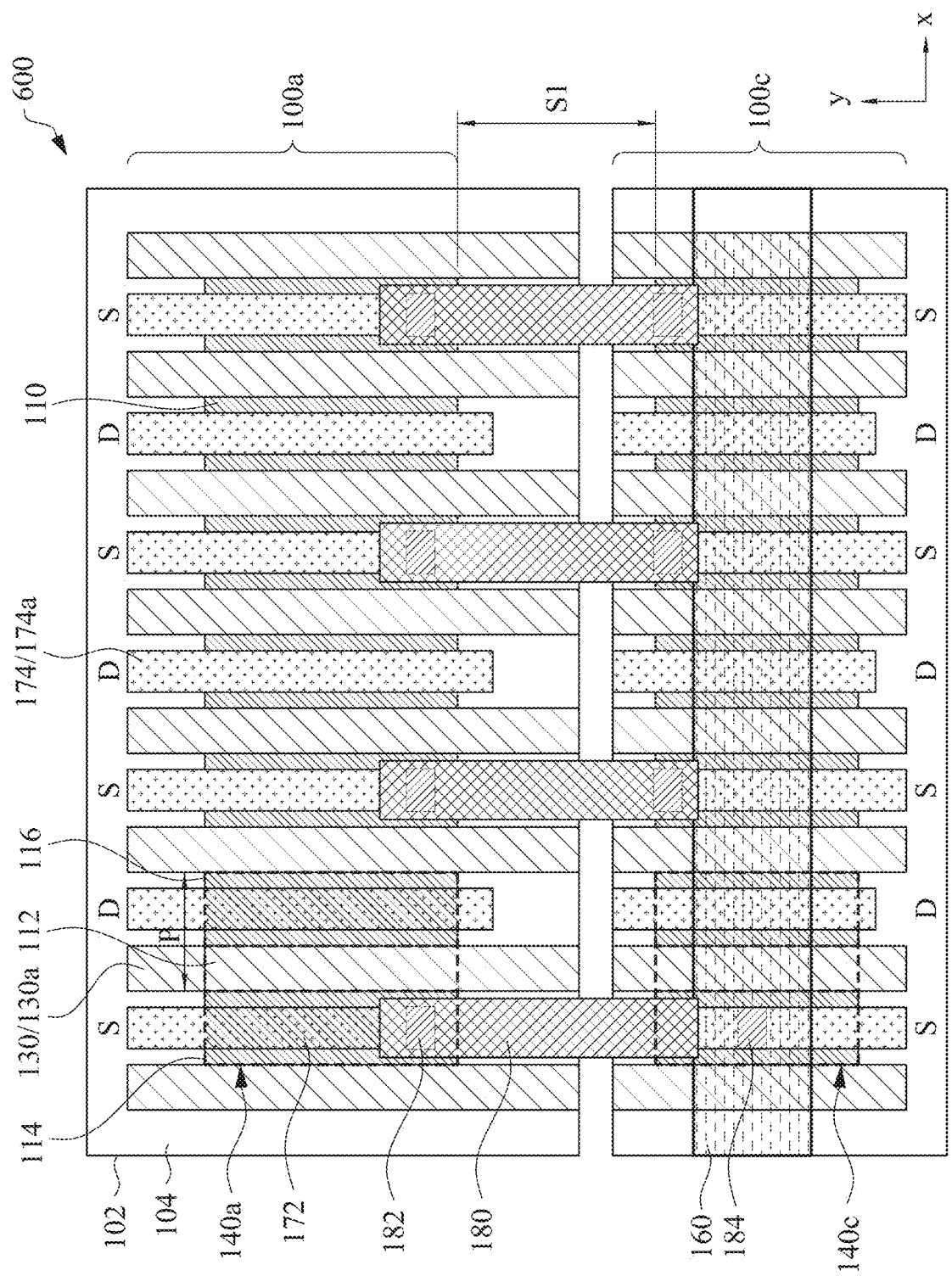
FIG. 6 is a plan view of a layout of a semiconductor device, in accordance with some embodiments.

FIG. 6 is a plan view of a layout 600 of a semiconductor device, in accordance with some embodiments. In comparison with layout 100 in FIG. 1A, in layout 600 dummy FinFETs 140*c* in a dummy device region 100*c* replace FinFETs 140*b* in guard ring region 100*b*. Components in FIG. 6 that are the same or similar to those in FIGS. 1A-1C are given the same references numbers, and detailed description thereof is thus omitted.

Referring to FIG. 6, layout 600 includes FinFETs 140*a* in active device region 100*a* and dummy FinFETs 140*c* in a dummy device region 100*c* that is in a close proximity to active device region 100*a*. As used herein, a dummy structure is referred to as a structure which is utilized to mimic a physical property of another structure and which is circuit inoperable (i.e., which is not part of a circuit current flow path) in the final fabricated device. Dummy FinFETs 140*c* thus are substantially identical in configuration to FinFET 140*a* in active device region 100*a*, but are not used to control current flow between source and drain regions based on a gate voltage. Detailed description for components of dummy FinFETs 140*c* are therefore omitted. Because no current is flow through dummy FinFETs 140*c*, dummy FinFETs 140*c* help to remove heat from FinFETs 140*a* in active device region 110*a* through the underlying substrate. In some embodiments, dummy FinFETs 140*c* are included in layout 600 not only to dissipate heat, but also to mitigate the impact of non-idealities with respect to active FinFETs (i.e., FinFETs 140*a*) occurred during fabrication, thereby making manufacturability of the resulted integrated circuit more efficient. A minimum spacing S1 allowed by design rules between active device region 100*a* and dummy device region 100*c* is desirable to maximize heat dissipation rate.

In layout 600, channel block layer 160 is over dummy device region 100*c* and is aligned with channel regions of dummy FinFETs 140*c*. The presence of channel block layer 160 in dummy device region 100*c* indicates that a semiconductor material having a higher thermal conductivity than the semiconductor material providing channel regions 112 of FinFETs 140*a* in active device region 100*a* is utilized as a channel material for dummy FinFETs 140*c* in dummy device region 100*c*. Dummy FinFETs 140*c* are usable as heat sinks to facilitate heat dissipation to the underlying substrate.

Layout 600 is able to dissipate generated heat out of the structure by way of underlying substrate, source contact structures 172 and interconnect metal layers 180.

One of ordinary skill would understand that any of the features discussed above with respect to FIGS. 2-5 including epitaxial block layer (FIG. 2), greater channel length (FIG. 3), greater gate pitch (FIG. 4) and NT_N layer (FIG. 5) are capable of being used to dummy FinFETs 140*c* in dummy device region 100*c* to maximize heat dissipation.

Figure 7:
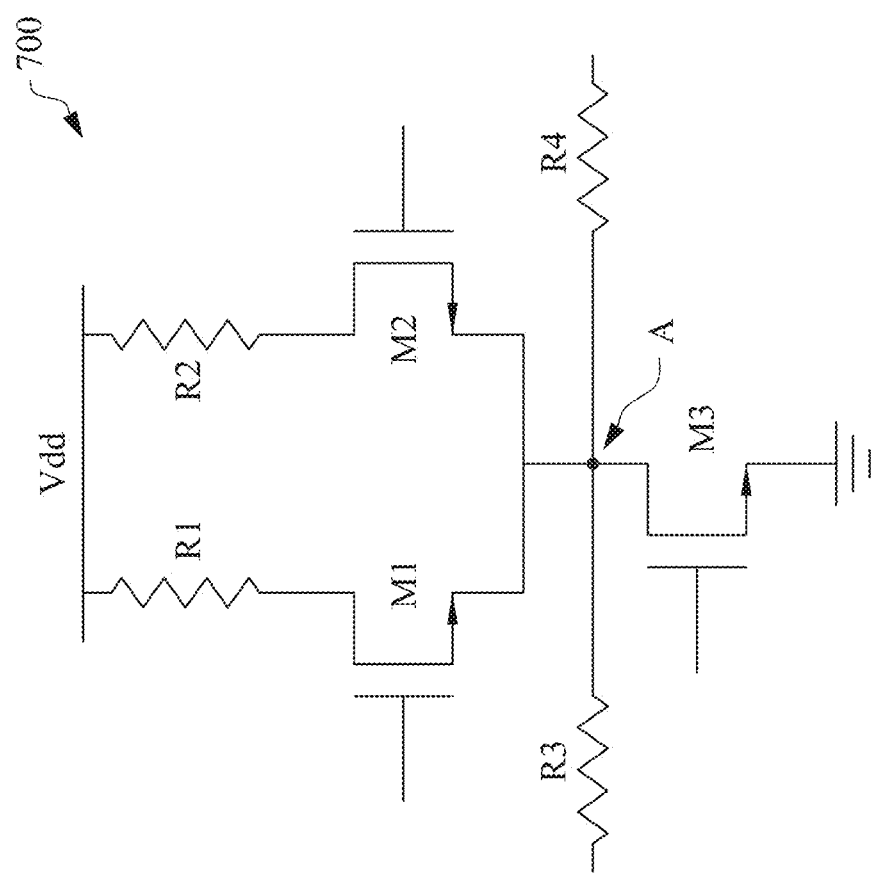
FIG. 7 is a schematic diagram of an analog circuit, in accordance with some embodiments.

FIG. 7 is a schematic diagram of an analog circuit 700, in accordance with some embodiments. Referring to FIG. 7, analog circuit 700 includes transistors M1, M2 and M3, and resistors R1, R2, R3 and R4.

Transistors M1 and M2 each have source terminals electrically coupled to one another at node A. A drain terminal of transistor M1 is electrically coupled to a first terminal of resistor R1, and a drain terminal of transistor M2 is electrically coupled to a first terminal of resistor R2. A second terminal of resistor R1 and a second terminal of R2 are electrically coupled to a supply voltage Vdd. A drain terminal of transistor M3 is electrically coupled to node A, and a source terminal of transistor M3 is coupled to ground. Resistors R3 and R4 each have a first terminal coupled to node N, and a second terminal being floating. Resistors R3 and R4 are configured to be located in close proximity to transistors M1 and M2, respectively. Because the second terminals of respective resistor R3 and R4 are floating and no current flows through resistor R3 or R4, resistors R3 and R4 are usable to dissipate heat generated by respective transistors M1 and M2.

Figure 8A:
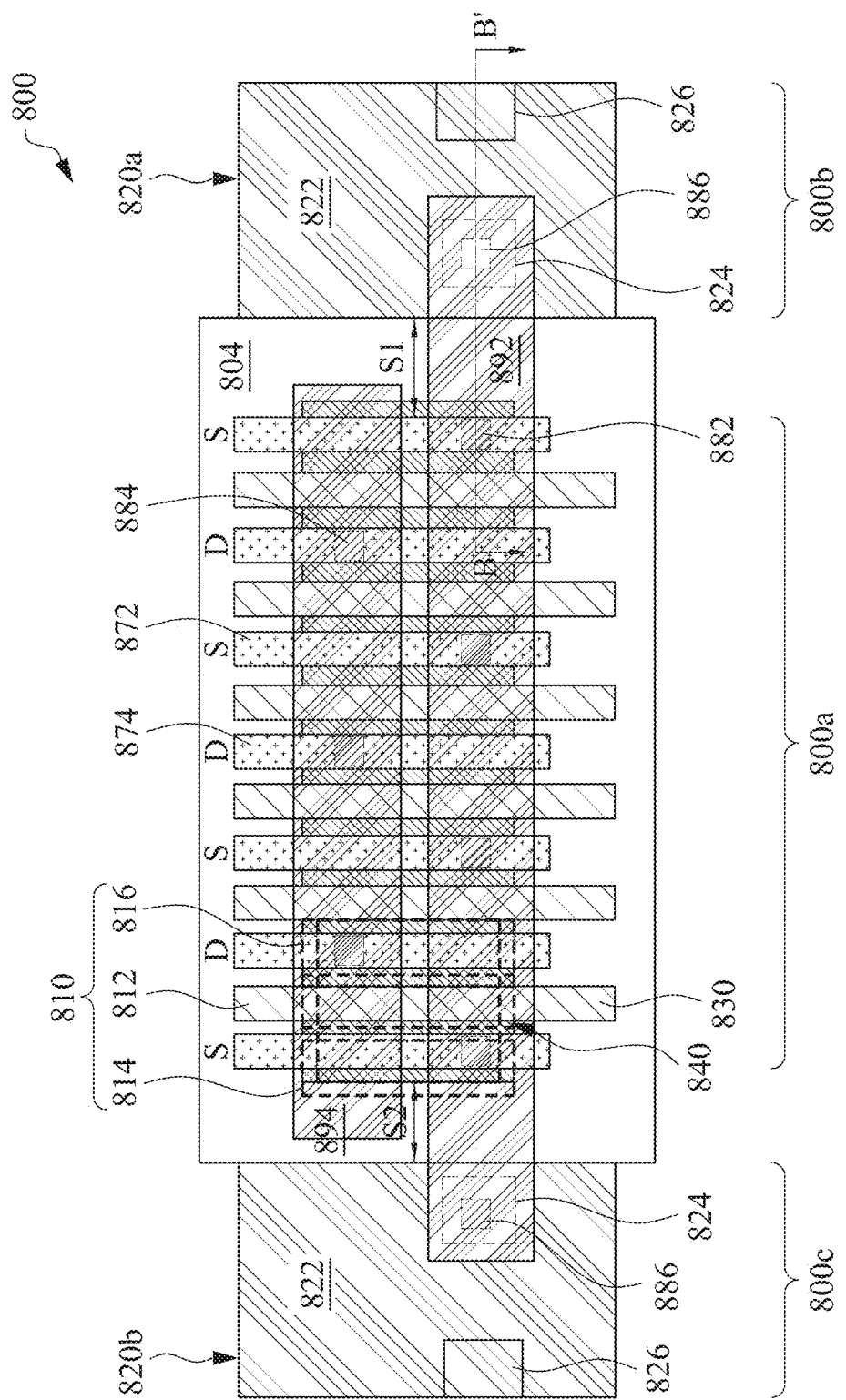
FIG. 8A is a plan view of a layout of an analog circuit, in accordance with some embodiments.

FIG. 8A is a plan view of a layout 800 of an analog circuit, in accordance with some embodiments.

Referring to FIG. 8A, layout 800 includes at least one semiconductor fin 810 and a plurality of gate structures 830 in an active device region 800*a*. Gate structures 830 cross semiconductor fin 810, thereby defining a plurality of FinFETs 840 in active device region 800*a*. Each FinFET 840 includes a gate structure 830 across a channel region 812 of semiconductor fin 810, and a source region 814 and a drain region 816 on opposite sides of the gate structure 830 surrounding channel region 812.

Layout 800 further includes a first resistor 820*a* in a first passive device region 800*b* adjacent to a first side of active device region 800*a*, and a second resistor 820*b* in a second passive device region 800*c* adjacent to a second side of active device region 800*a*. Active device region 800*a*, first passive device region 800*b* and second passive device region 800*c* are separated from one another by isolation structures 804. First passive device region 800*b* is separated from active device region 800*a* by a first spacing S1, and second passive device region 800*c* is separated from active device region 800*a* by a second spacing S2. A minimum spacing allowed by design rules for spacing S1, S2 is desirable to maximize heat dissipation rate. Each resistor 820*a*, 820*b* includes a doped well 822, and a first heavily doped region 824 and a second heavily doped region 826 in doped well 822.

Layout 800 further includes a plurality of source contact structures 872 and a plurality of drain contact structures 874. Each source contact structure 872 overlies a corresponding source region 814 to provide electrical connection to the corresponding source region 814. Each drain contact structure 874 overlies a corresponding drain region 816 to provide electrical connection to the corresponding drain region 816.

Layout 800 further includes a plurality of source vias 882 contacting respective source contact structures 872, a plurality of drain vias 884 contacting respective drain contact structures 874, and a plurality of resistor vias 886 contacting first heavily doped regions 824 of respective resistors 820a, 820b.

Layout 800 further includes a first interconnect metal layer 892 over source vias 882 and resistor vias 886. First interconnect metal layer 892 couples source regions 814 to first heavily doped regions 824 of respective resistors 820a, 820b by way of source contact structures 872, source vias 882 and resistor vias 886. Heat generated by FinFETs 840 thus is able to be dissipated from source regions 814 of FinFETs 840 to resistors 820a through first interconnect metal layer 892. Second heavily doped regions 826 of respective resistors 820a, 820b are left floating, so that no current flows through respective resistors 820a, 820b. The resistors 820a, 820b thus function as heat sinks to allow heat generated by FinFETs 840 in active device region 800a to resistors 820a, 820b.

Layout 800 further includes a second interconnect metal layer 894 over drain vias 884. Second interconnect metal layer 894 couples drain regions 816 of FinFETs 840 together.

Figure 8B:
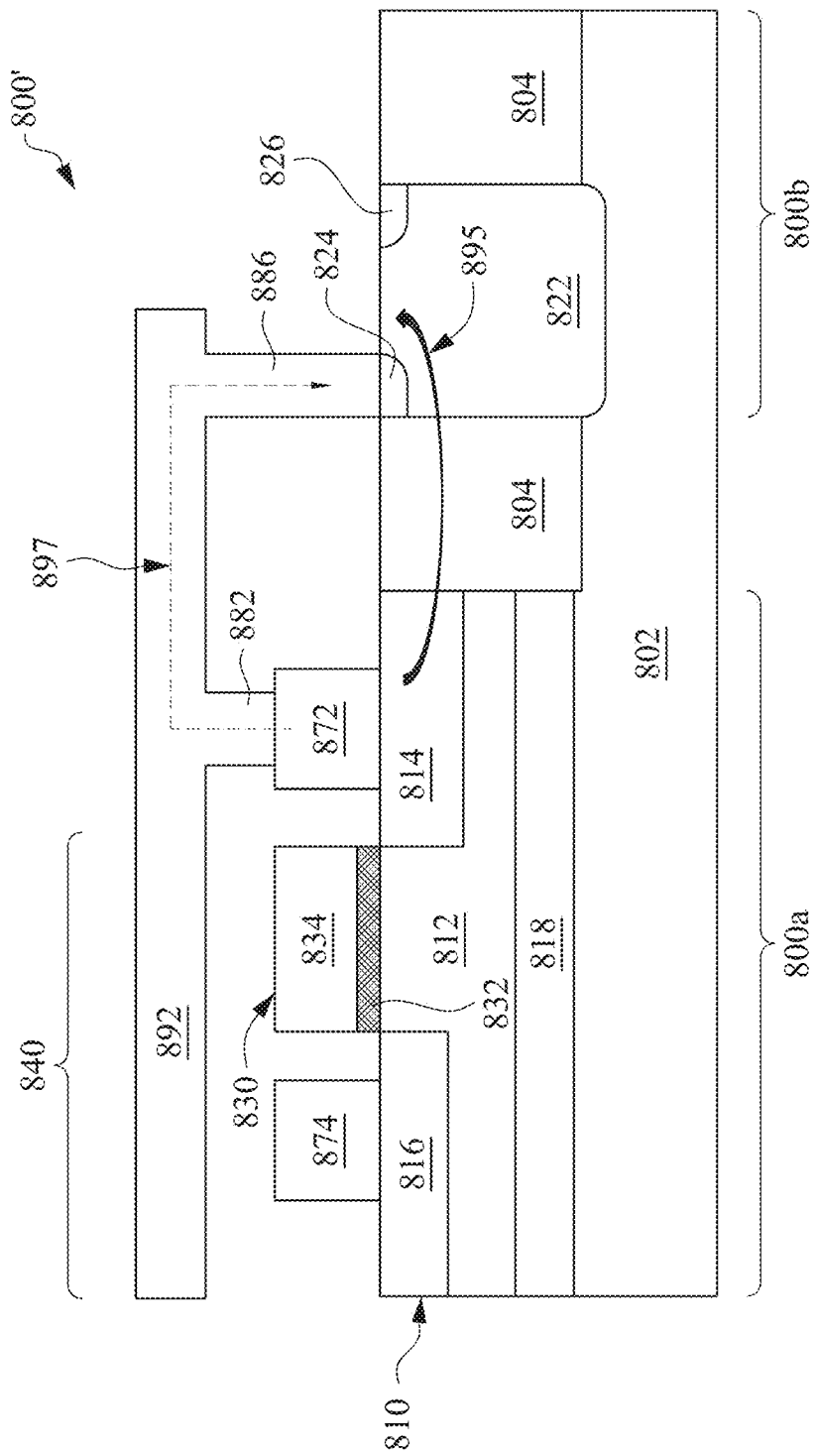
FIG. 8B is a cross-section view of a semiconductor device manufactured according to the layout of FIG. 8A and taken along line B-B' in FIG. 8A.

FIG. 8B is a cross-section view of a semiconductor device 800' manufactured according to the layout 800 depicted in FIG. 8A and taken along line B-B' in FIG. 8A. Semiconductor device 800' is a non-limited example for facilitating the illustration of the present disclosure.

Semiconductor device 800' includes a substrate 102 such as a silicon substrate. In some embodiments, substrate 802 is doped with p-type dopants such as boron. In other embodiments, substrate 802 is doped with n-type dopants such as phosphorous or arsenic.

Semiconductor device 800' includes a plurality of FinFETs 840 formed in active device region 800a of substrate 802. In some embodiments, FinFETs 840 are configured as pFinFETs. In some embodiments, FinFETs 840 are configured as nFinFETs. Each FinFET 840 includes a channel region 812, a source region 814 on a first side of channel region 812, a drain region 816 on a second side of channel region 812, and a gate structure 830 over channel region 812. Each gate structure 830 includes a gate dielectric layer 832 and a gate electrode layer 834. FinFETs 840 are substantially identical in configuration to FinFETs 140a described above in FIGS. 1B-1C and FIGS. 2B-2C. Materials described above to various components of FinFETs 140a in FIGS. 1B and 1C are applicable to corresponding components of FinFETs 840.

Each FinFET 840 is formed over a SRB layer 818. In some embodiments, SRB layer 818 includes SiGe configured to provide a stress to the overlying channel region 812.

Semiconductor device 800' further includes a first resistor 820a formed in a first passive device region 800b of substrate 802 and a second resistor 820b formed in a second passive device region 800c (FIG. 8A). In some embodiments, each resistor 820a, 820b is configured as an n-well resistor. In some embodiments, each resistor 820a, 820b is configured as a p-well resistor. Each resistor 820a, 820b includes a doped well 822 and heavily doped regions 824, 826 formed in substrate 802. Respective passive device regions 800b, 800c are separated from active device region 800a by isolation structures 804. In some embodiments, isolation structures 804 include a dielectric material described above with respect to isolation structures 104.

Doped wells 822 are formed in substrate 802. In some embodiments, each doped well 822 is doped with dopants having an opposite doping polarity than substrate 102. In some embodiments, each doped well 822 is an n-well for formation of an n-well resistor. In some embodiments, each doped well 822 is a p-well for formation of a p-well resistor. Heavily doped regions 824, 826 are formed at the upper surface of each doped well 822 and adjoined to isolation structures 804. Heavily doped regions 824, 826 have the same doping polarity as doped wells 822, but with a higher doping concentration.

Semiconductor device 800' further includes source contact structures 872 over respective source regions 814 and drain contact structures 874 over respective drain regions 816. In some embodiments, source contact structures 872 and drain contact structures 874 include cobalt, copper or tungsten.

Semiconductor device 800' further includes source vias 882 over respective source contact structures, 872, drain vias 884 (FIG. 8A) over respective drain contact structures 874, and resistor vias 886 over respective heavily doped regions 824. A first interconnect metal layer 892 is over source vias 882 and resistor vias 886 to couple source regions 814 of respective FinFETs 840 to heavily doped region 824 of each resistor 820a, 820b. A second interconnect metal layer 894 is over drain vias to couple drain regions 816 of respective FinFETs 840. Heavily doped region 826 of each resistor 820a, 820b is left floating. Vias 882, 884, 886 and interconnect metal layers 892, 894 include a metal such as aluminum, copper, tungsten, or alloys thereof.

The dashed arrows in FIG. 8B show the heat dissipation paths in semiconductor device 800'. Because no current is flow through respective resistors 820a, 820b, resistors 820a, 820b that are in close proximity of FinFETs 840 function as heat sinks to remove a majority of heat generated by FinFETs 840 to passive device regions 880b, 800c of substrate 802 as indicated by arrow 895. In addition, some of heat generated by FinFETs 840 is able to be dissipated from source regions 814 of FinFETs 840 to resistors 820a, 820b by way of source contact structures 872, source vias 882, first interconnect metal layer 892 and resistor vias 886 as indicated by arrow 897.

While specific examples of n- or p-well resistors are described, other types of resistors such as, for example, polysilicon resistors, TiN resistors, metal resistors, or OD (active area) resistors are contemplated and within the scope of the present disclosure.

Figure 9:
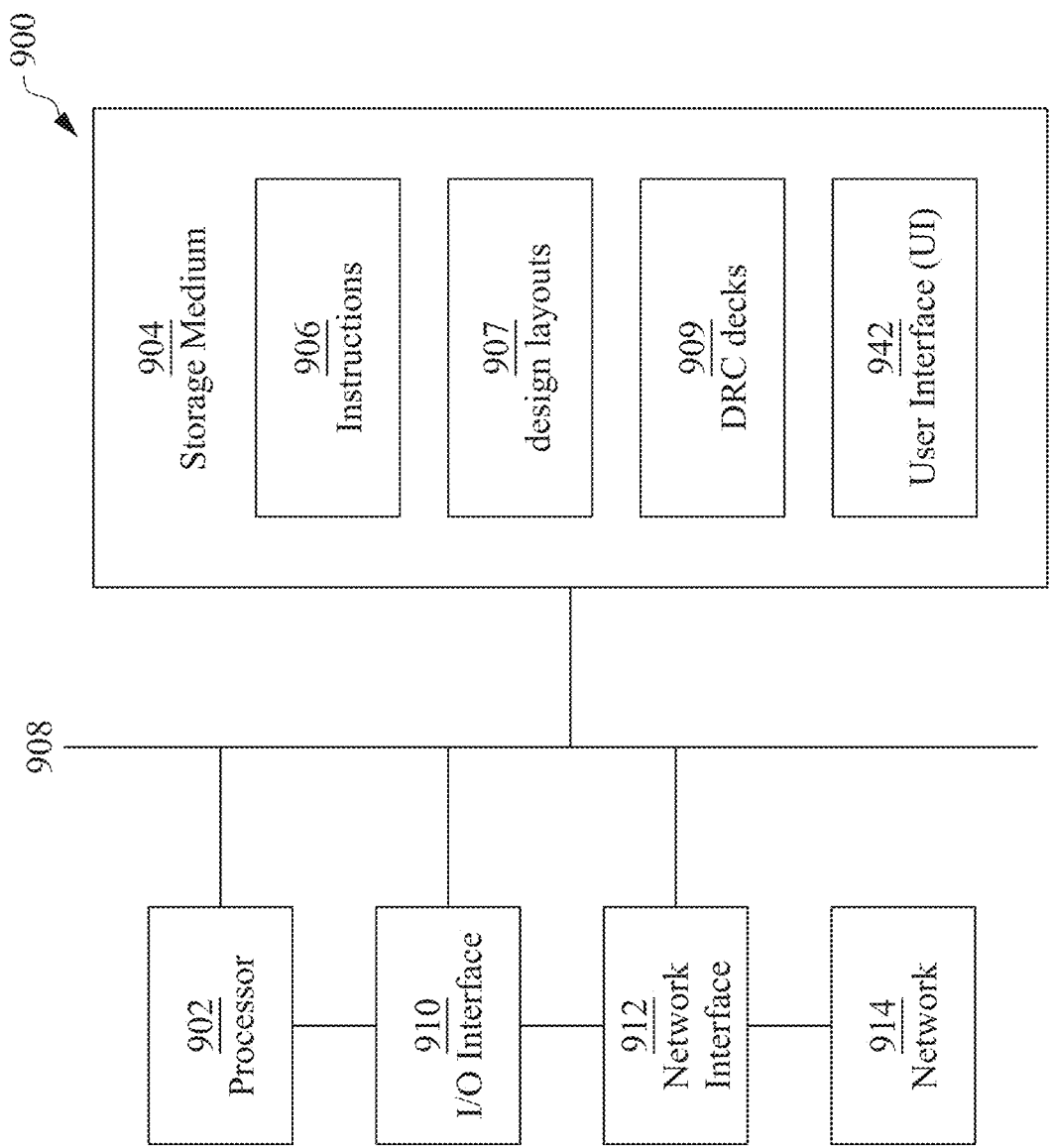
FIG. 9 is a schematic diagram of a system for designing a layout of a semiconductor device, in accordance with some embodiments.

FIG. 9 is a schematic diagram of an electronic design automation (EDA) system 900, in accordance with some embodiments. Methods described herein of generating design layouts, e.g., layouts 100, 200, 300, 400, 500, 600 and 800, in accordance with one or more embodiments, are implementable, for example, using EDA system 900, in accordance with some embodiments. In some embodiments, EDA system 900 is a general purpose computing device including a hardware processor 902 and a non-transitory, computer-readable storage medium 904. Computer-readable storage medium 904, amongst other things, is encoded with, i.e., stores, a set of executable instructions 906, design layouts 907, design rule check (DRC) decks 909 or any intermediate data for executing the set of instructions. Each design layout 907 comprises a graphical representation of an integrated chip, such as for example, a GSII file. Each DRC deck 909 comprises a list of design rules specific to a semiconductor process chosen for fabrication of a design layout 907. Execution of instructions 906, design layouts 907 and DRC decks 909 by hardware processor 902 represents (at least in part) an EDA tool which implements a portion or all of, e.g., the methods described herein in accordance with one or more (hereinafter, the noted processes and/or methods).

Processor 902 is electrically coupled to computer-readable storage medium 904 via a bus 908. Processor 902 is also electrically coupled to an I/O interface 910 by bus 908. A network interface 912 is also electrically connected to processor 902 via bus 908. Network interface 912 is connected to a network 914, so that processor 902 and computer-readable storage medium 904 are capable of connecting to external elements via network 914. Processor 902 is configured to execute instructions 906 encoded in computer-readable storage medium 904 in order to cause EDA system 900 to be usable for performing a portion or all of the noted processes and/or methods. In one or more embodiments, processor 902 is a central processing unit (CPU), a multi-processor, a distributed processing system, an application specific integrated circuit (ASIC), and/or a suitable processing unit.

In one or more embodiments, computer-readable storage medium 904 is an electronic, magnetic, optical, electromagnetic, infrared, and/or a semiconductor system (or apparatus or device). For example, computer-readable storage medium 904 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 904 includes a compact disk-read only memory (CD-ROM), a compact disk-read/write (CD-R/W), and/or a digital video disc (DVD).

In one or more embodiments, computer-readable storage medium 904 stores instructions 906, design layouts 907 and DRC decks 909 configured to cause EDA system 900 (where such execution represents (at least in part) the EDA tool) to be usable for performing a portion or all of the noted processes and/or methods. In one or more embodiments, storage medium 904 also stores information which facilitates performing a portion or all of the noted processes and/or methods.

EDA system 900 includes I/O interface 910. I/O interface 910 is coupled to external circuitry. In one or more embodiments, I/O interface 910 includes a keyboard, keypad, mouse, trackball, trackpad, touchscreen, and/or cursor direction keys for communicating information and commands to processor 902.

EDA system 900 also includes network interface 912 coupled to processor 902. Network interface 912 allows EDA system 900 to communicate with network 914, to which one or more other computer systems are connected. Network interface 912 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more EDA systems 900.

EDA system 900 is configured to receive information through I/O interface 910. The information received through I/O interface 910 includes one or more of instructions, data, design rules, libraries of standard cells, and/or other parameters for processing by processor 902. The information is transferred to processor 902 via bus 908. EDA system 900 is configured to receive information related to a user interface (UI) 942 through I/O interface 910. The information is stored in computer-readable medium 904 as UI 942.

In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 10:
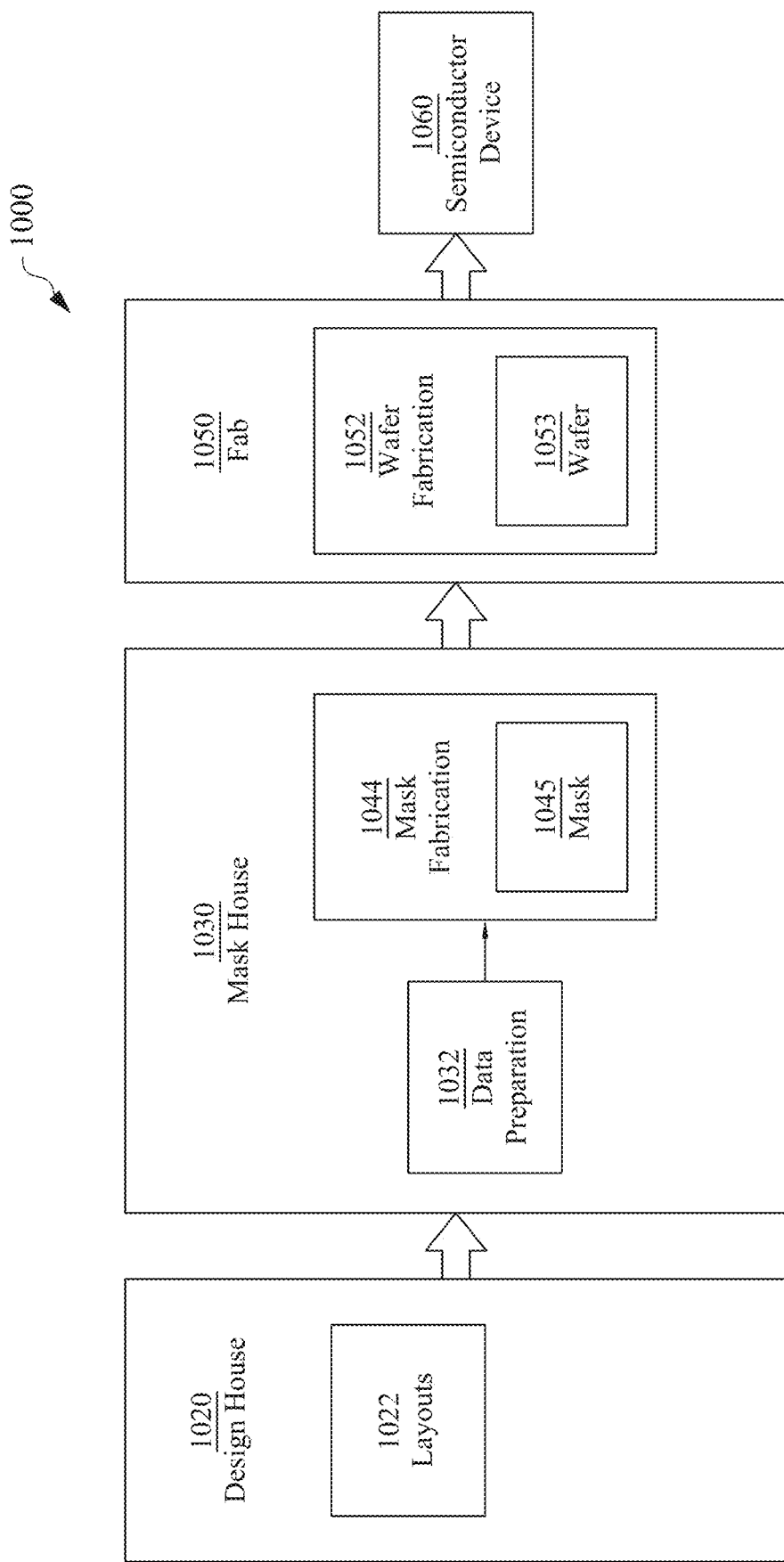
FIG. 10 is a block diagram of a manufacturing system for making a semiconductor device, in accordance with some embodiments.

FIG. 10 is a block diagram of a semiconductor device manufacturing system 1000, and a device manufacturing flow associated therewith, in accordance with some embodiments. In some embodiments, based on design layout, e.g., layout 100, 200, 300, 400, 500, 600, 800, at least one of one or more semiconductor masks or at least one component in a layer of a semiconductor integrated circuit is fabricated using semiconductor device manufacturing system 1000.

In FIG. 10, semiconductor device manufacturing system 1000 includes entities, such as a design house 1020, a mask house 1030, and a semiconductor device manufacturer/fabricator ("fab") 1050, that interact with one another in the design, development, and manufacturing cycles and/or services related to manufacturing semiconductor device 1060. The entities in semiconductor device manufacturing system 1000 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1020, mask house 1030, and fab 1050 is owned by a single larger company. In some embodiments, two or more of design house 1020, mask house 1030, and fab 1050 coexist in a common facility and use common resources.

Design house (or design team) 1020 generates a design layout 1022. Design layout 1022 includes various geometrical patterns designed for a semiconductor device 1060. The geometrical patterns correspond to patterns of metal, oxide, or semiconductor layers that make up the various components of semiconductor device 1060 to be fabricated. The various layers combine to form various device features. For example, a portion of design layout 1022 includes various circuit features, such as an active region, gate structures, source contact structures and drain contact structures, and metal lines or vias of interconnection, to be formed in a semiconductor substrate (such as a silicon wafer) and various material layers disposed on the semiconductor substrate. Design house 1020 implements a proper design procedure to form design layout 1022. The design procedure includes one or more of logic design, physical design or place and route. Design layout 1022 is presented in one or more data files having information of the geometrical patterns. For example, design layout 1022 can be expressed in a GDSII file format or DFII file format.

Mask house 1030 includes mask data preparation 1032 and mask fabrication 1044. Mask house 1030 uses design layout 1022 to manufacture one or more masks 1045 to be used for fabricating the various layers of semiconductor device 1060 according to design layout 1022. Mask house 1030 performs mask data preparation 1032, where design layout 1022 is translated into a representative data file ("RDF"). Mask data preparation 1032 provides the RDF to mask fabrication 1044. Mask fabrication 1044 includes a mask writer. A mask writer converts the RDF to an image on a substrate, such as a mask (reticle) 1045 or a semiconductor wafer 1053. Design layout 1022 is manipulated by mask data preparation 1032 to comply with particular characteristics of the mask writer and/or requirements of fab 1050. In FIG. 10, mask data preparation 1032 and mask fabrication 1044 are illustrated as separate elements. In some embodiments, mask data preparation 1032 and mask fabrication 1044 can be collectively referred to as mask data preparation.

In some embodiments, mask data preparation 1032 includes optical proximity correction (OPC) which uses lithography enhancement techniques to compensate for image errors, such as those that can arise from diffraction, interference, other process effects and the like. OPC adjusts design layout 1022. In some embodiments, mask data preparation 1032 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1032 includes a mask rule checker (MRC) that checks design layout 1022 that has undergone processes in OPC with a set of mask creation rules which contain certain geometric and/or connectivity restrictions to ensure sufficient margins, to account for variability in semiconductor manufacturing processes, and the like. In some embodiments, the MRC modifies design layout 1022 to compensate for limitations during mask fabrication 1044, which may undo part of the modifications performed by OPC in order to meet mask creation rules.

In some embodiments, mask data preparation 1032 includes lithography process checking (LPC) that simulates processing that will be implemented by fab 1050 to fabricate semiconductor device 1060. LPC simulates this processing based on design layout 1022 to create a simulated manufactured device, such as semiconductor device 1060. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine design layout 1022.

One of ordinary skill would understand that the above description of mask data preparation 1032 has been simplified for the purposes of clarity. In some embodiments, mask data preparation 1032 includes additional features such as a logic operation (LOP) to modify design layout 1022 according to manufacturing rules. Additionally, the processes applied to design layout 1022 during mask data preparation 1032 may be executed in a variety of different orders.

After mask data preparation 1032 and during mask fabrication 1044, a mask 1045 or a group of masks 1045 are fabricated based on design layout 1022. In some embodiments, mask fabrication 1044 includes performing one or more lithographic exposures based on design layout 1022. In some embodiments, an electron-beam (e-beam) or a mechanism of multiple e-beams is used to form a pattern on a mask (e.g., a photomask, or a reticle) 1045 based on design layout 1022. Mask 1045 can be formed in various technologies. In some embodiments, mask 1045 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque regions and transmits through the transparent regions. In one example, a binary mask version of mask 1045 includes a transparent substrate (e.g., fused quartz) and an opaque material (e.g., chromium) coated in the opaque regions of the binary mask. In another example, mask 1045 is formed using a phase shift technology. In a phase shift mask (PSM) version of mask 1045, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1044 is used in a variety of processes. For example, such a mask(s) is used in an ion implantation process to form various doped regions in semiconductor wafer 1053, in an etching process to form various etching regions in semiconductor wafer 1053, and/or in other suitable processes.

Fab 1050 includes wafer fabrication 1052. Fab 1050 is an IC fabrication business that includes one or more manufacturing facilities for the fabrication of a variety of different IC products. In some embodiments, fab 1050 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (BEOL fabrication), and a third manufacturing facility may provide other services for the foundry business.

Fab 1050 uses mask(s) 1045 fabricated by mask house 1030 to fabricate semiconductor device 1060. Thus, fab 1050 at least indirectly uses design layout 1022 to fabricate semiconductor device 1060. In some embodiments, semiconductor wafer 1053 is fabricated by fab 1050 using mask(s) 1045 to form semiconductor device 1060. In some embodiments, the device fabrication includes performing one or more lithographic exposures based at least indirectly on design layout 1022. Semiconductor wafer 1053 includes a silicon substrate or other proper substrate having material layers formed thereon. Semiconductor wafer 1053 further includes one or more of various doped regions, dielectric features, multilevel interconnects, and the like (formed at subsequent manufacturing steps).

Details regarding an integrated circuit (IC) manufacturing system (e.g., semiconductor device manufacturing system 1000 of FIG. 10), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

An aspect of this description relates to a layout of a semiconductor device. The layout is stored on a non-transitory computer-readable medium and includes a first transistor in an active device region, the first transistor comprising a first channel region a first source region and a first drain region. The layout further includes a second transistor in a guard ring region, the second transistor comprising a second channel region a second source region and a second drain region. The second channel region includes a semiconductor material having a higher thermal conductivity than a semiconductor material of the first channel region. In some embodiments, the first channel region is aligned with the second channel region. In some embodiments, the layout further includes a first gate structure over the first channel region; and a second gate structure over the second channel region, wherein the first gate structure is electrically disconnected from the second gate structure. In some embodiments, the layout further includes a source contact, wherein the source contact extends over the first source region and the second source region. In some embodiments, the layout further includes an isolation structure, wherein a first portion of the isolation structure is between the first channel region and the second channel region. In some embodiments, the first channel region is between a second portion of the isolation region and the second channel region. In some embodiments, the second channel region includes silicon. In some embodiments, a dopant concentration in the silicon is less than about $1 \times 10^{13}$ atoms/cm$^3$.

An aspect of this description relates to a system for processing a layout of a semiconductor device. The system includes a processor; and a non-transitory computer readable storage medium connected to the at least one processor, wherein the non-transitory computer readable medium is configured to store instructions. The processor is configured to execute the instructions to generate a first transistor in an active device region, wherein the first transistor comprising a first channel region. The processor is further configured to generate a second transistor in a guard ring region, wherein the second transistor comprise a second channel region, and a thermal conductivity of the second channel region is greater than a thermal conductivity of the first channel region. In some embodiments, the processor is configured to transmit data for manufacturing at least one mask based on the generated first transistor and the generated second transistor. In some embodiments, the processor is configured to transmit data for manufacturing a semiconductor device based on the generated first transistor and the generated second transistor. In some embodiments, the processor is configured to generate the first transistor and to generate the second transistor using design rules stored in the non-transitory computer readable medium. In some embodiments, the processor is configured to receive information related to a computer-aided design (CAD) library. In some embodiments, the processor is configured to generate a NT_N layer adjacent to the second transistor using the received information.

An aspect of this description relates to a semiconductor device. The semiconductor device includes a substrate and a transistor in an active device region of the substrate, the transistor includes a channel region and a source/drain (S/D) region. The semiconductor device further includes a resistor in a passive device region of the substrate. The semiconductor device further includes a contact structure overlying the S/D region. The semiconductor device further includes an interconnect layer electrically coupling the contact structure and a first terminal of the resistor, wherein a second terminal of the resistor is floating. In some embodiments, the resistor includes a doped well. In some embodiments, the semiconductor device further includes an isolation structure between the channel region and the doped well. In some embodiments, a depth of the doped well is greater than a depth of the isolation structure. In some embodiments, the semiconductor device further includes a strained relaxed buffer (SRB) layer below the channel region. In some embodiments, the SRB layer includes silicon germanium (SiGe).

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. Although features of various embodiments are expressed in certain combinations among the claims, it is contemplated that these features can be arranged in any combination and order. It is therefore intended that the protection granted hereon be limited only by the definition contained in the appended claims and equivalents thereof.

What is claimed is:
1. A semiconductor device comprising:
 a first transistor in an active device region, the first transistor comprising a first channel region a first source region and a first drain region; and
 a second transistor in a guard ring region, the second transistor comprising a second channel region a second source region and a second drain region,
 wherein the second channel region comprises a semiconductor material having a higher thermal conductivity than a semiconductor material of the first channel region.
2. The semiconductor device of claim 1, wherein the first channel region is aligned with the second channel region.
3. The semiconductor device of claim 1, further comprising:
 a first gate structure over the first channel region; and
 a second gate structure over the second channel region, wherein the first gate structure is electrically disconnected from the second gate structure.
4. The semiconductor device of claim 1, further comprising a source contact, wherein the source contact extends over the first source region and the second source region.
5. The semiconductor device of claim 1, further comprising an isolation structure, wherein a first portion of the isolation structure is between the first channel region and the second channel region.
6. The semiconductor device of claim 5, wherein the first channel region is between a second portion of the isolation structure and the second channel region.
7. The semiconductor device of claim 1, wherein the second channel region comprises silicon.
8. The semiconductor device of claim 7, wherein a dopant concentration in the silicon is less than about $1 \times 10^{13}$ atoms/cm$^3$.
9. A semiconductor device, comprising:
 a first transistor in an active device region, wherein the first transistor comprising a first channel region,
 a second transistor in a guard ring region, wherein the second transistor comprise a second channel region, and a thermal conductivity of the second channel region is greater than a thermal conductivity of the first channel region.
10. The semiconductor device of claim 9, wherein the second transistor is a fin field effect transistor (FinFET).
11. The semiconductor device of claim 9, wherein the first transistor is a fin field effect transistor (FinFET).
12. The semiconductor device of claim 9, wherein a source of the first transistor is electrically connected to a source of the second transistor.

13. The semiconductor device of claim 9, wherein a gate of the first transistor is aligned with a gate of the second transistor in a plan view.

14. The semiconductor device of claim 9, further comprising a NT_N layer adjacent to the second transistor.

15. A semiconductor device, comprising:
- a substrate;
- a transistor in an active device region of the substrate, the transistor comprising a channel region and a source/drain (S/D) region;
- a resistor in a passive device region of the substrate;
- a contact structure overlying the S/D region; and
- an interconnect layer electrically coupling the contact structure and a first terminal of the resistor, wherein a second terminal of the resistor is floating.

16. The semiconductor device of claim 15, wherein the resistor comprises a doped well.

17. The semiconductor device of claim 16, further comprising an isolation structure between the channel region and the doped well.

18. The semiconductor device of claim 17, wherein a depth of the doped well is greater than a depth of the isolation structure.

19. The semiconductor device of claim 15, further comprising a strained relaxed buffer (SRB) layer below the channel region.

20. The semiconductor device of claim 19, wherein the SRB layer comprises silicon germanium (SiGe).

* * * * *